(12) United States Patent
Arima

(10) Patent No.: US 12,744,553 B2
(45) Date of Patent: Sep. 22, 2026

(54) RADIO-FREQUENCY CIRCUIT AND COMMUNICATION DEVICE

(71) Applicant: Murata Manufacturing Co., Ltd., Nagaokakyo (JP)

(72) Inventor: Keisuke Arima, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 331 days.

(21) Appl. No.: 18/499,326

(22) Filed: Nov. 1, 2023

(65) Prior Publication Data

US 2024/0195441 A1 Jun. 13, 2024

(30) Foreign Application Priority Data

Dec. 12, 2022 (JP) ................................ 2022-197962

(51) Int. Cl.
*H04B 1/04* (2006.01)
*H03F 3/19* (2006.01)
*H03H 11/04* (2006.01)

(52) U.S. Cl.
CPC ................ *H04B 1/04* (2013.01); *H03F 3/19* (2013.01); *H03H 11/04* (2013.01); *H03F 2200/451* (2013.01)

(58) Field of Classification Search
None
See application file for complete search history.

(56) References Cited

U.S. PATENT DOCUMENTS

2018/0324967 A1* 11/2018 Mcgehee ................. H03F 3/19
2022/0021354 A1* 1/2022 Jiang ...................... H03F 1/223

FOREIGN PATENT DOCUMENTS

JP 2006-237978 A 9/2006
JP 2019-036856 A 3/2019
JP 2021-027369 A 2/2021

* cited by examiner

*Primary Examiner* — Akwasi M Sarpong
*Assistant Examiner* — Gabrielle N Dai
(74) *Attorney, Agent, or Firm* — XSENSUS LLP

(57) ABSTRACT

A radio-frequency circuit includes a common terminal and a common terminal, a filter connected to the common terminal and the common terminal and having a first pass band, a filter connected to the common terminal and the common terminal and having a second pass band, and a cancellation circuit connected to the common terminal and the common terminal, connected in parallel with the filter and the filter, and configured to vary at least one of an amplitude and a phase in the bandpass characteristics.

19 Claims, 13 Drawing Sheets

5
2
120
53a
53
53b
53c
47
48
45
46
F-Tx
16
A-Rx
11
E-Rx
15
432
442
80
X
Y
43
44
431
441
30
61
62
110
130
140

RADIO-FREQUENCY CIRCUIT AND COMMUNICATION DEVICE

CROSS-REFERENCE TO RELATED APPLICATION

This application claims priority to Japanese Patent Application No. JP 2022-197962 filed on Dec. 12, 2022. The entire contents of the above-identified application, including the specifications, drawings and claims, are incorporated herein by reference in their entirety.

BACKGROUND OF THE DISCLOSURE

1. Field of the Disclosure

The present disclosure relates to a radio-frequency circuit and a communication device.

2. Description of the Related Art

Japanese Unexamined Patent Application Publication No. 2019-36856 discloses a multiplexer in which a transmission-side filter and a reception-side filter are connected in common. A cancellation circuit is connected to the transmission-side filter to cancel out components in a predetermined frequency band transmitted along a transmission path.

SUMMARY OF THE DISCLOSURE

In the multiplexer (radio-frequency circuit) disclosed in Japanese Unexamined Patent Application Publication No. 2019-36856, the cancellation circuit is added only to the transmission-side filter. Similarly, by adding a cancellation circuit to the reception-side filter, transmission characteristics such as bandpass characteristics of the reception-side filter and isolation between transmission and reception can be improved.

However, in multiplexers (radio-frequency circuits) where the number of filters connected in common has increased with the development of multiband, adding a cancellation circuit for each filter will result in larger radio-frequency circuits.

An object of the present disclosure is to solve the above problem and to provide a compact radio-frequency circuit and a communication device with improved transmission characteristics of radio-frequency signals.

To achieve the above-mentioned object, a radio-frequency circuit according to one aspect of the present disclosure includes a first common terminal and a second common terminal, a first bandpass filter connected to the first common terminal and the second common terminal and having a first pass band, a second bandpass filter connected to the first common terminal and the second common terminal and having a second pass band, and a cancellation circuit connected to the first common terminal and the second common terminal, connected in parallel with the first bandpass filter and the second bandpass filter, and configured to vary at least one of an amplitude and a phase in the bandpass characteristics.

The present disclosure makes it possible to provide a compact radio-frequency circuit and a communication device with improved radio-frequency signal transmission characteristics.

DESCRIPTION OF THE EMBODIMENTS

Figure 1:
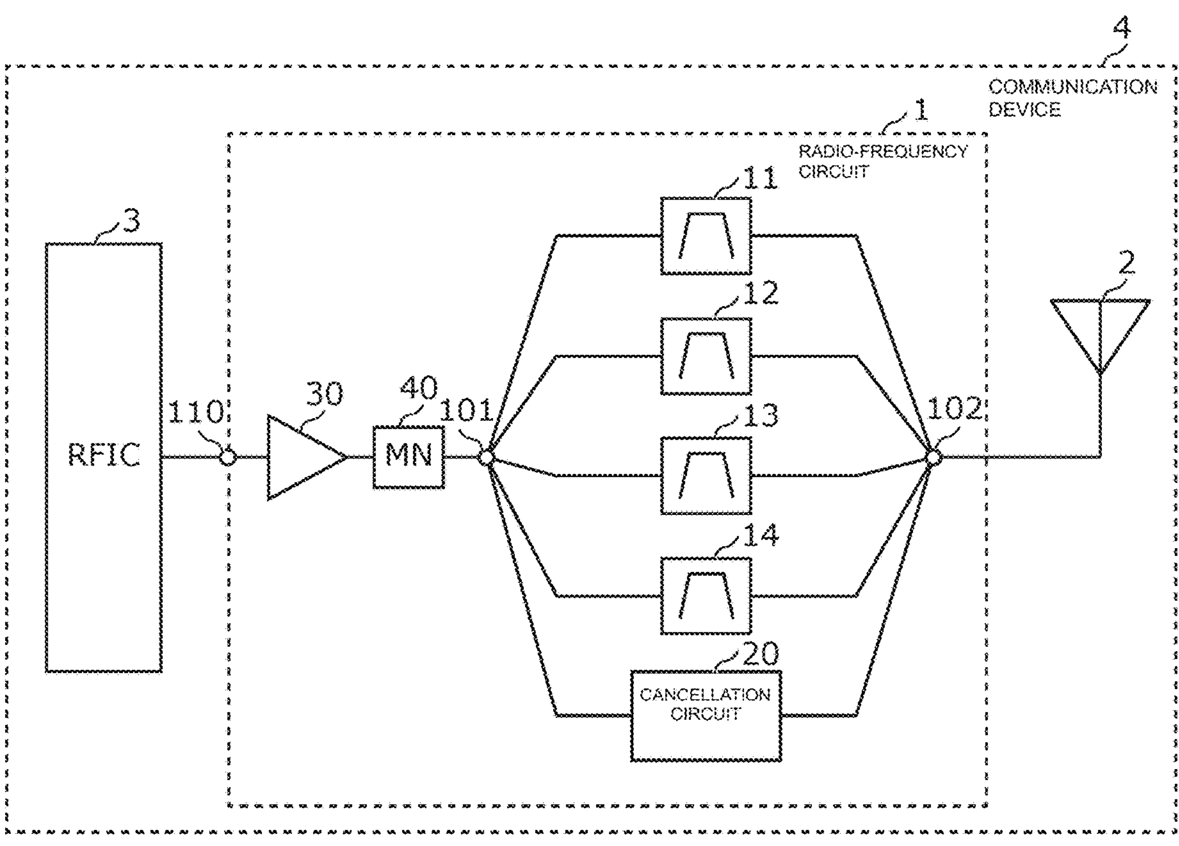
FIG. 1 is a diagram of a circuit configuration of a radio-frequency circuit and a communication device according to a first embodiment.

The following is a detailed description of the embodiments of the present disclosure. The embodiments described below are all comprehensive or specific examples. The numerical values, shapes, materials, components, the arrangement and connection configuration of the components, and the like illustrated in the following embodiments are examples and are not intended to limit the present disclosure. Among the components in the following examples and variations, components that are not described in the independent claims are described as optional components. The sizes or size ratios of the components illustrated in the drawings are not necessarily exact. In each drawing, substantially identical components are indicated by the same sign, and duplicate descriptions may be omitted or simplified.

Also, in the present disclosure, terms indicating relationships between elements, such as parallel and perpendicular, terms indicating the shape of elements, such as rectangular, and numerical ranges are not meant to express strict meaning only, but also to include substantially equivalent ranges, for example, differences of a few percent.

In the present disclosure, “connected” may include not only the case of being directly connected by connection terminals and/or wire conductors, but also the case of being electrically connected via other circuit elements. In addition, “connected between A and B” may include being connected to A and B in the path connecting A and B.

In the present disclosure, in plan view of a substrate includes viewing the substrate and circuit elements mounted on the substrate in an orthographic projection on a plane parallel to the main surface of the substrate.

In the disposition of components in the present disclosure, “components disposed on a substrate” includes the components being disposed on a main surface of the substrate and the components being disposed within the substrate. “Components disposed on the main surface of the substrate” includes, in addition to the components being disposed in contact with the main surface of the substrate, the components being disposed above the main surface without being in contact with the main surface (for example, a component being stacked on top of another disposed component in contact with the main surface). Also, “the component disposed on the main surface of the substrate” may include the component being placed in a recess formed in the main surface. “Components are disposed within the substrate” includes, in addition to the components being encapsulated within a module substrate, all of the components being disposed between the two main surfaces of the substrate but a portion of the components not being covered by the substrate, and only a portion of the components being disposed within the substrate.

In the present disclosure, “path” may include a transmission line constituted by a wire through which radio-frequency signals propagate, an electrode directly connected to the wire, and a terminal directly connected to the wire or the electrode.

In the present disclosure, “component A is disposed in series in path B” may include that both the signal input end and the signal output end of component A are connected to the wires, electrodes, or terminals constituting path B.

In the disposition of components of the present disclosure, circuit element A (or wire A) and circuit element B (or wire B) are disposed adjacent to each other (or next to each other) may include no other circuit element (or wire) between the circuit element A (or the wire A) and the circuit element B (or the wire B).

First Embodiment

1. Configuration of Radio-Frequency Circuit and Communication Device

The circuit configuration of a radio-frequency circuit 1 and a communication device 4 according to the present embodiment will be described with reference to FIG. 1. FIG. 1 is a diagram of a circuit configuration of the radio-frequency circuit 1 and the communication device 4 according to a first embodiment.

1.1 Circuit Configuration of Communication Device 4

First, the circuit configuration of the communication device 4 is described. As illustrated in FIG. 1, the communication device 4 according to the present embodiment is provided with the radio-frequency circuit 1, an antenna 2, and an RF signal processing circuit (RFIC: radio frequency integrated circuit) 3.

The radio-frequency circuit 1 transmits radio-frequency signals between the antenna 2 and the RFIC 3. The detailed circuit configuration of the radio-frequency circuit 1 will be described below.

The antenna 2 is connected to the radio-frequency circuit 1 and transmits radio-frequency signals output from the radio-frequency circuit 1. The antenna 2 may also receive radio-frequency signals from outside and output them to the radio-frequency circuit 1.

The RFIC 3 is an example of a signal processing circuit that processes radio-frequency signals. Specifically, the RFIC 3 signal processes transmission signals input from a baseband signal processing circuit (BBIC, not illustrated) through, for example, up-conversion and outputs the transmission signals generated by the signal processing to a transmission path of the radio-frequency circuit 1. The RFIC 3 may also signal process reception signals input via a reception path of the radio-frequency circuit 1 through, for example, down-conversion and output the reception signals generated by the signal processing to the BBIC.

The RFIC 3 also functions as a control unit that controls a supply voltage and a bias voltage (current) supplied to amplifiers of the radio-frequency circuit 1. Part or all of the functions of the RFIC 3 as the control unit may be implemented outside of the RFIC 3, for example, in the BBIC or the radio-frequency circuit 1.

The antenna 2 is an optional component of the communication device 4 according to the present embodiment.

1.2 Circuit Configuration of Radio-Frequency Circuit 1

Next, the circuit configuration of the radio-frequency circuit 1 will be described. As illustrated in FIG. 1, the radio-frequency circuit 1 is provided with filters 11, 12, 13, and 14, a cancellation circuit 20, a power amplifier 30, a matching circuit 40, common terminals 101 and 102, and a signal input terminal 110.

The signal input terminal 110 is connected to the RFIC 3 and the power amplifier 30.

The common terminal 101 is an example of a first common terminal and is connected to an input end of the filter 11, an input end of the filter 12, an input end of the filter 13, an input end of the filter 14, one end of the cancellation circuit 20, and one end of the matching circuit 40.

The common terminal 102 is an example of a second common terminal and is connected to an output end of the filter 11, an output end of the filter 12, an output end of the filter 13, an output end of the filter 14, the other end of the cancellation circuit 20, and the antenna 2.

The filter 11 is an example of a first bandpass filter, is connected to the common terminals 101 and 102, and has a first pass band. The filter 12 is an example of a second bandpass filter, is connected to the common terminals 101 and 102, and has a second pass band. The filter 13 is connected to the common terminals 101 and 102 and has a third pass band. The filter 14 is connected to the common terminals 101 and 102 and has a fourth pass band.

Each of the filters 11 to 14 is a bandpass filter constituted by, for example, an acoustic wave resonator.

The cancellation circuit 20 is connected to the common terminals 101 and 102, connected in parallel with the filters

11 to 14, and is configured to vary at least one of an amplitude and a phase in the bandpass characteristics.

The cancellation circuit 20 is capable of generating a signal component having a phase substantially opposite to the component in a predetermined frequency band of the radio-frequency signal that passes through the filters 11 to 14 at the common terminal 102. In this case, the cancellation circuit 20 varies the above-described predetermined frequency band and at least one of an amplitude and a phase of the signal component having a substantially opposite phase, depending on which of the filters 11 to 14 the above-described radio-frequency signal passes through.

In the present disclosure, a filter (circuit) is defined as an element (or circuit) having a pass band with an insertion loss of less than 5 dB. In contrast, a cancellation circuit is defined as a circuit that has an insertion loss of 10 dB or more over a frequency range from the DC (direct current) to three times the frequency of the high frequency end of the highest frequency side out of the high frequency ends of the pass band of a plurality of filters connected in parallel with the cancellation circuit.

In other words, the cancellation circuit 20 may not be a filter (circuit) but may function as a variable attenuator that attenuates the desired frequency band of the radio-frequency signal that passes through any of the filters 11 to 14.

No bandpass filter is connected to the path connecting the common terminal 101, the cancellation circuit 20, and the common terminal 102.

Furthermore, no acoustic wave filter is connected to the path connecting the common terminal 101, the cancellation circuit 20, and the common terminal 102.

The power amplifier 30 is an example of a first amplifier, and its output end is connected to the common terminal 101 via the matching circuit 40. The power amplifier 30 is an amplifier that amplifies the transmission signal, but may instead be a low-noise amplifier that amplifies the reception signal received by the antenna 2.

The matching circuit 40 is connected between the power amplifier 30 and the common terminal 101, and is a circuit for providing impedance matching between the power amplifier 30 and the filters 11 to 14. The matching circuit 40, for example, has a configuration in which at least one of an inductor and a capacitor is connected to the path connecting the power amplifier 30 and the common terminal 101.

According to the above-described configuration of the radio-frequency circuit 1, the frequency band of the radio-frequency signal transmitted through the radio-frequency circuit 1 determines the path (through which of the filters 11 to 14 the radio-frequency signal passes) for transmitting the radio-frequency signal. The bandpass characteristics of the filters 11 to 14 can be improved by varying the bandpass characteristics of the cancellation circuit 20 according to the frequency bandwidth of the radio-frequency signal (depending on which of the paths of the filters 11 to 14 the above-described radio-frequency signal passes through). In addition, since one cancellation circuit 20 is shared by a plurality of filters, which are the filters 11 to 14, instead of disposing a cancellation circuit in each of the filters 11 to 14, the compact radio-frequency circuit 1 with improved transmission characteristics of radio-frequency signals can be provided.

The power amplifier 30, the filters 13 and 14, and the matching circuit 40 may be omitted in the radio-frequency circuit 1 according to the present embodiment.

Figure 2:
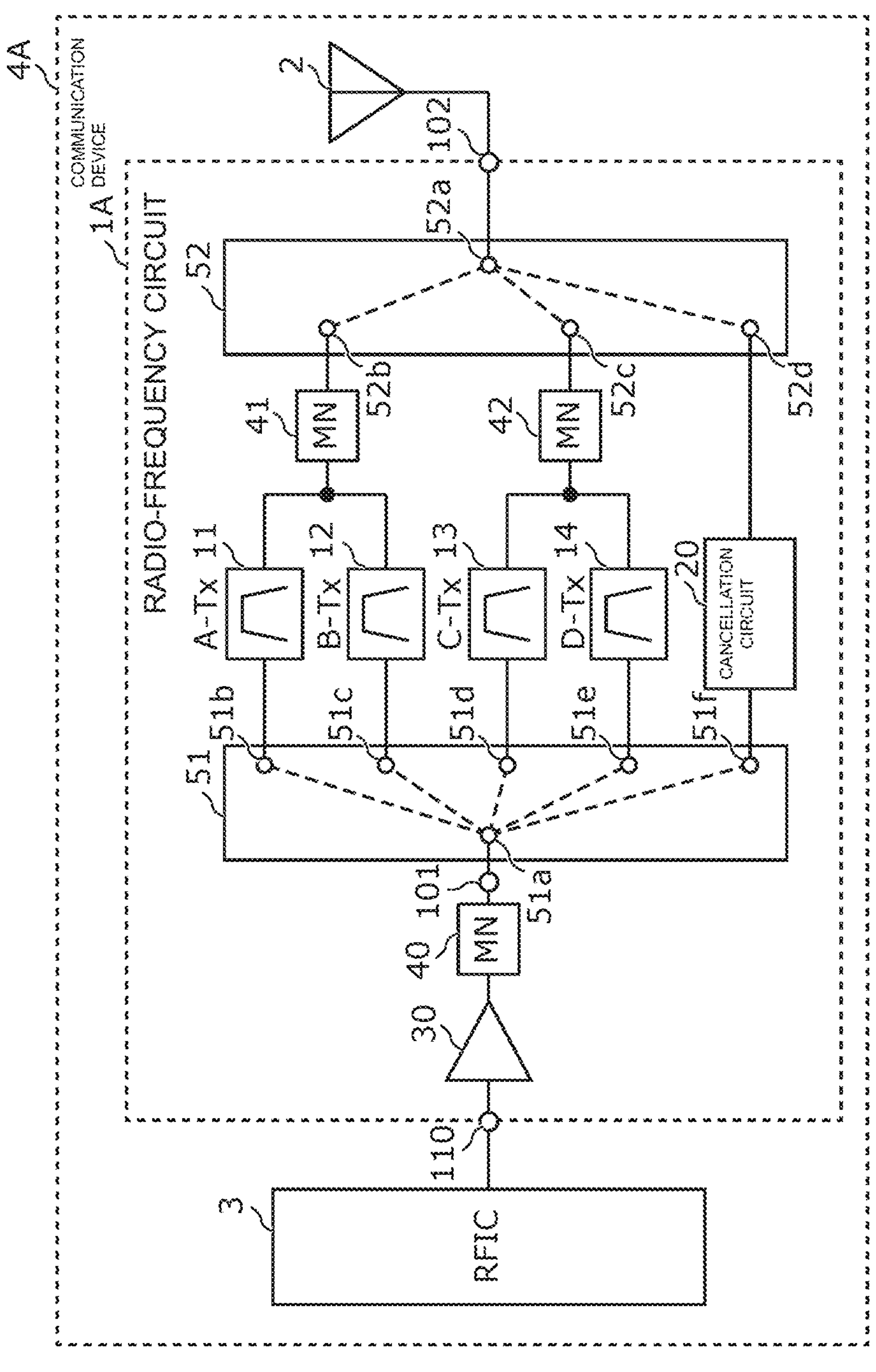
FIG. 2 is a diagram of a circuit configuration of a radio-frequency circuit and a communication device according to a first variation of the first embodiment.

1.2 Circuit Configuration of Radio-Frequency Circuit 1A and Communication Device 4A According to First Variation Next, a circuit configuration of a radio-frequency circuit 1A and a communication device 4A according to a first variation will be described with reference to FIG. 2. FIG. 2 is a diagram of a circuit configuration of the radio-frequency circuit 1A and the communication device 4A according to the first variation of the first embodiment. The communication device 4A is provided with the radio-frequency circuit 1A, the antenna 2, and the RFIC 3. The communication device 4A according to this variation differs from the communication device 4 according to the first embodiment in the configuration of the radio-frequency circuit 1A. Therefore, the configuration of the radio-frequency circuit 1A will be described below.

As illustrated in FIG. 2, the radio-frequency circuit 1A is provided with the filters 11, 12, 13, and 14, the cancellation circuit 20, switches 51 and 52, the power amplifier 30, matching circuits 40, 41, and 42, the common terminals 101 and 102, and the signal input terminal 110. The radio-frequency circuit 1A according to this variation differs from the radio-frequency circuit 1 according to the first embodiment mainly in that the switches 51 and 52 are added. The following describes the radio-frequency circuit 1A according to this variation with a focus on the different configurations, while omitting descriptions of the same configurations of the radio-frequency circuit 1 according to the first embodiment.

The common terminal 101 is an example of the first common terminal and is connected to the input end of the filter 11, the input end of the filter 12, the input end of the filter 13, the input end of the filter 14, and one end of the cancellation circuit 20 via the switch 51 and also to one end of the matching circuit 40.

The common terminal 102 is an example of the second common terminal and is connected to the output end of the filter 11, the output end of the filter 12, the output end of the filter 13, the output end of the filter 14, and the other end of the cancellation circuit 20 via the switch 52 and also to the antenna 2.

The switch 51 is an example of a first switch and is disposed between the common terminal 101, and the filters 11 to 14 and the cancellation circuit 20. The switch 51 has terminals 51*a*, 51*b*, 51*c*, 51*d*, 51*e*, and 51*f* and switches the connection between the terminal 51*a* and at least one of the terminals 51*b* to 51*f*. The terminal 51*a* is connected to the common terminal 101, the terminal 51*b* is connected to the input end of the filter 11, the terminal 51*c* is connected to the input end of the filter 12, the terminal 51*d* is connected to the input end of the filter 13, the terminal 51*e* is connected to the input end of the filter 14, and the terminal 51*f* is connected to the one end of the cancellation circuit 20. The terminal 51*f* may be connected to the terminal 51*a* at all times.

The switch 52 is an example of a second switch and is disposed between the common terminal 102, and the filters 11 to 14 and the cancellation circuit 20. The switch 52 has terminals 52*a*, 52*b*, 52*c*, and 52*d* and switches the connection between the terminal 52*a* and at least one of the terminals 52*b* to 52*d*. The terminal 52*a* is connected to the common terminal 102, the terminal 52*b* is connected to the output end of the filter 11 and the output end of the filter 12 via the matching circuit 41, the terminal 52*c* is connected to the output end of the filter 13 and the output end of the filter 14 via the matching circuit 42, and the terminal 52*d* is connected to the other end of the cancellation circuit 20. The terminal 52*d* may be connected to the terminal 52*a* at all times.

In the radio-frequency circuit 1A according to this variation, the common terminal 101 may be omitted, in which case the terminal 51*a* is the first common terminal. Also, the common terminal 102 may be omitted, in which case the terminal 52*a* is the second common terminal.

The matching circuit 41 provides impedance matching between the filters 11 and 12, and the switch 52 and the antenna 2. The matching circuit 42 provides impedance matching between the filters 13 and 14, and the switch 52 and the antenna 2.

The cancellation circuit 20 is connected to the common terminal 101 via the switch 51 and to the common terminal 102 via the switch 52 and is configured to vary at least one of an amplitude and a phase in the bandpass characteristics.

According to the above-described configuration of the radio-frequency circuit 1A, the path (through which of the filters 11 to 14 the radio-frequency signal passes) for transmitting the radio-frequency signal is selected by the switches 51 and 52 switching their connections according to the frequency band of the radio-frequency signal to be transmitted through the radio-frequency circuit 1A. This improves the isolation characteristics between the filters 11 to 14. The bandpass characteristics of the filters 11 to 14 can be improved by varying the bandpass characteristics of the cancellation circuit 20 in response to the switching of the switches 51 and 52. In addition, since one cancellation circuit 20 is shared by a plurality of filters, which are the filters 11 to 14, instead of disposing a cancellation circuit in each of the filters 11 to 14, the compact radio-frequency circuit 1A with improved transmission characteristics of radio-frequency signals can be provided.

The power amplifier 30, the filters 13 and 14, and the matching circuits 40, 41, and 42 may be omitted in the radio-frequency circuit 1A according to this variation.

1.3 Circuit Configuration of Cancellation Circuit

Next, an example of a specific circuit configuration of the cancellation circuit 20 according to the present embodiment will be described.

Figure 3A:
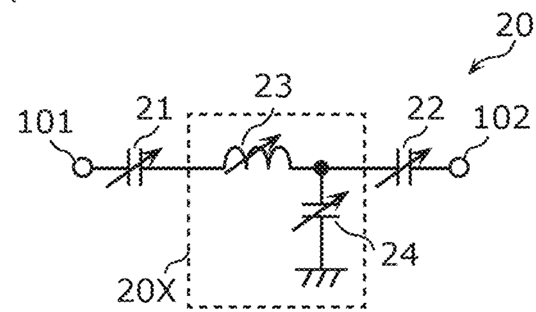
FIG. 3A is a diagram of a circuit configuration of a cancellation circuit according to the first embodiment.

FIG. 3A is a diagram of a circuit configuration of the cancellation circuit 20 according to the first embodiment. As illustrated in the diagram, the cancellation circuit 20 is provided with variable capacitors 21, 22, and 24, and a variable inductor 23.

The variable capacitor 21 is an example of a first variable capacitor and is disposed in the path connecting the common terminal 101 and the common terminal 102. The variable capacitor 22 is an example of a second variable capacitor and is disposed in the path connecting the common terminal 101 and the common terminal 102. In the radio-frequency circuit 1A according to the first variation, the variable capacitor 21 is disposed in the path connecting the common terminal 101 and the switch 52, and the variable capacitor 22 is disposed in the path connecting the common terminal 102 and the switch 51.

The variable capacitors 21 and 22 are primarily capable of adjusting the amplitude of the radio-frequency signal passing through the cancellation circuit 20.

The variable inductor 23 is an example of a first inductor and is connected to variable capacitors 21 and 22. The variable capacitor 24 is connected between the path connecting the variable capacitors 21 and 22 and the ground.

The variable inductor 23 and the variable capacitor 24 constitute a phase adjuster 20X, which can primarily adjust the phase of the radio-frequency signal passing through the cancellation circuit 20.

In the cancellation circuit 20, at least one of the variable capacitors 21, 22, and 24 need only be an element with a variable capacitance value, while the others may be elements with a fixed capacitance value. The variable inductor 23 may be an element with a fixed inductance value.

Figure 3B:
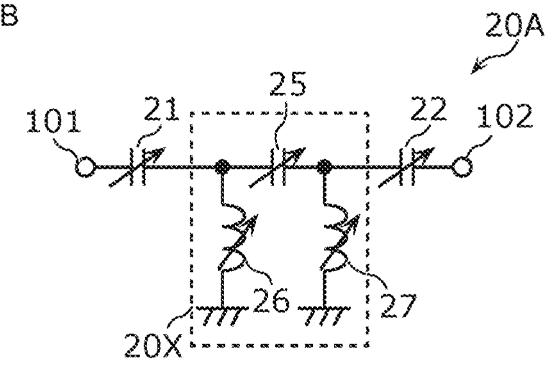
FIG. 3B is a diagram of a circuit configuration of a cancellation circuit according to a second variation of the first embodiment.

FIG. 3B is a diagram of a circuit configuration of a cancellation circuit 20A according to a second variation of the first embodiment. As illustrated in the diagram, the cancellation circuit 20A is provided with variable capacitors 21, 22, and 25 and variable inductors 26 and 27. The variable capacitor 25 and the variable inductors 26 and 27 constitute the phase adjuster 20X. The cancellation circuit 20A according to this variation differs from the cancellation circuit 20 according to the first embodiment in the configuration of the phase adjuster 20X. The following describes the cancellation circuit 20A according to this variation with a focus on the different configurations, while omitting descriptions of the same configurations of the cancellation circuit 20 according to the first embodiment.

The variable capacitor 25 is connected to the variable capacitors 21 and 22. The variable inductor 26 is an example of a second inductor and is connected between the path connecting the variable capacitors 21 and 25 and the ground. The variable inductor 27 is an example of the second inductor and is connected between the path connecting the variable capacitors 22 and 25 and the ground.

The variable inductors 26 and 27 and the variable capacitor 25 constitute the phase adjuster 20X, which can primarily adjust the phase of the radio-frequency signal passing through the cancellation circuit 20A.

In the cancellation circuit 20A, at least one of the variable capacitors 21, 22, and 25 need only be an element with a variable capacitance value, while the others may be elements with a fixed capacitance value. At least one of the variable inductors 26 and 27 may be an element with a fixed inductance value.

Figure 3C:
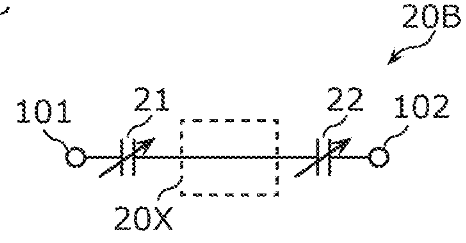
FIG. 3C is a diagram of a circuit configuration of a cancellation circuit according to a third variation of the first embodiment.

FIG. 3C is a diagram of a circuit configuration of a cancellation circuit 20B according to a third variation of the first embodiment. As illustrated in the diagram, the cancellation circuit 20B is provided with the variable capacitors 21 and 22. The wires connecting the variable capacitors 21 and 22 constitute the phase adjuster 20X. The cancellation circuit 20B according to this variation differs from the cancellation circuit 20 according to the first embodiment in the configuration of the phase adjuster 20X. The following describes the cancellation circuit 20B according to this variation with a focus on the different configurations, while omitting descriptions of the same configurations of the cancellation circuit 20 according to the first embodiment.

The wires connecting the variable capacitors 21 and 22 constitute the phase adjuster 20X, which can primarily adjust the phase of the radio-frequency signal passing through the cancellation circuit 20B.

In the cancellation circuit 20B, at least one of the variable capacitors 21 and 22 need only be an element with a variable capacitance value, while the other may be an element with a fixed capacitance value.

In the cancellation circuit 20B, one of the variable capacitors 21 and 22 may be omitted. In other words, the variable capacitors 21 and 22 connected in series may be replaced by a single variable capacitor.

Figure 3D:
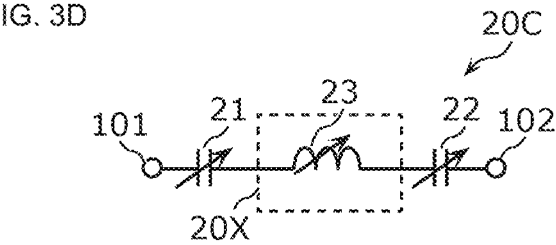
FIG. 3D is a diagram of a circuit configuration of a cancellation circuit according to a fourth variation of the first embodiment.

FIG. 3D is a diagram of a circuit configuration of a cancellation circuit 20C according to a fourth variation of the first embodiment. As illustrated in the diagram, the cancellation circuit 20C is provided with the variable capacitors 21 and 22 and the variable inductor 23. The variable inductor 23 constitutes the phase adjuster 20X. The cancellation circuit 20C according to this variation differs from the cancellation circuit 20 according to the first embodiment in the configuration of the phase adjuster 20X. The following describes the cancellation circuit 20C according to this variation with a focus on the different configurations, while omitting descriptions of the same configurations of the cancellation circuit 20 according to the first embodiment.

The variable inductor 23 is an example of the first inductor and is connected to the variable capacitors 21 and 22. The variable inductor 23 constitutes the phase adjuster 20X, which can primarily adjust the phase of the radio-frequency signal passing through the cancellation circuit 20C.

In the cancellation circuit 20C, at least one of the variable capacitors 21 and 22 need only be an element with a variable capacitance value, while the other may be an element with a fixed capacitance value. The variable inductor 23 may be an element with a fixed inductance value.

Figure 3E:
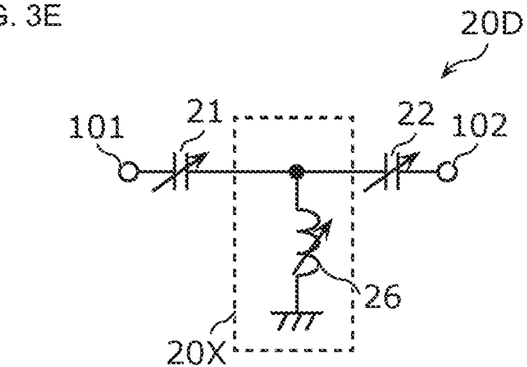
FIG. 3E is a diagram of a circuit configuration of a cancellation circuit according to a fifth variation of the first embodiment.

FIG. 3E is a diagram of a circuit configuration of a cancellation circuit 20D according to a fifth variation of the first embodiment. As illustrated in the diagram, the cancellation circuit 20D is provided with variable capacitors 21 and 22 and a variable inductor 26. The variable inductor 26 constitutes the phase adjuster 20X. The cancellation circuit 20D according to this variation differs from the cancellation circuit 20 according to the first embodiment in the configuration of the phase adjuster 20X. The following describes the cancellation circuit 20D according to this variation with a focus on the different configurations, while omitting descriptions of the same configurations of the cancellation circuit 20 according to the first embodiment.

The variable inductor 26 is an example of the second inductor and is connected between the path connecting the variable capacitors 21 and 22 and the ground. The variable inductor 26 constitutes the phase adjuster 20*x*, which can primarily adjust the phase of the radio-frequency signal passing through the cancellation circuit 20D.

In the cancellation circuit 20D, at least one of the variable capacitors 21 and 22 need only be an element with a variable capacitance value, while the other may be an element with a fixed capacitance value. The variable inductor 26 may be an element with a fixed inductance value.

1.4 Configuration of Radio-Frequency Circuit 1B According to Sixth Variation Next, a configuration of a radio-frequency circuit 1B according to a sixth variation will be described.

Figure 4:
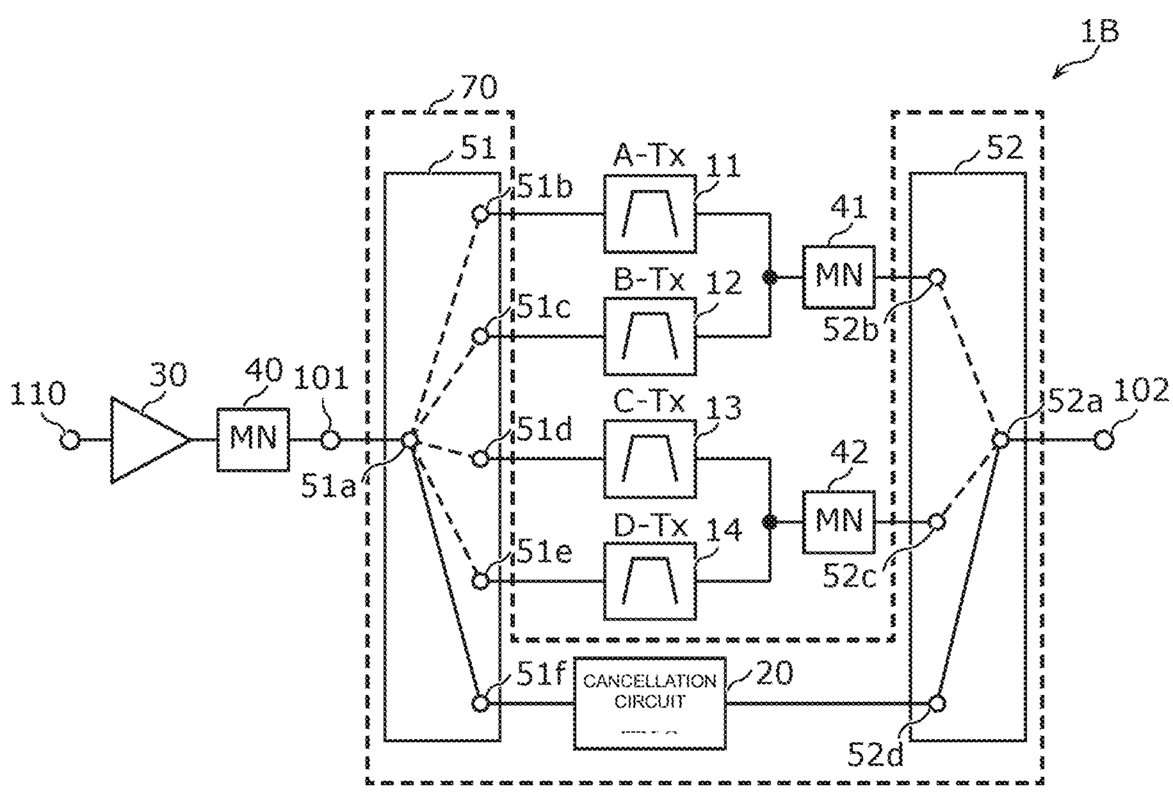
FIG. 4 is a diagram of a circuit configuration of a radio-frequency circuit according to a sixth variation of the first embodiment.

FIG. 4 is a diagram of a circuit configuration of the radio-frequency circuit 1B according to the sixth variation of the first embodiment. As illustrated in the diagram, the radio-frequency circuit 1B is provided with the filters 11, 12, 13, and 14, the switches 51 and 52, the cancellation circuit 20, the power amplifier 30, the matching circuit 40, the common terminals 101 and 102, and the signal input terminal 110. The radio-frequency circuit 1B according to this variation differs from the radio-frequency circuit 1A according to the first variation in that the switches 51 and 52 and the cancellation circuit 20 are included in a single semiconductor IC (integrated circuit). The following describes the radio-frequency circuit 1B according to this variation with a focus on the different configurations, while omitting descriptions of the same configurations of the radio-frequency circuit 1A according to the first variation.

The switches 51 and 52 and the cancellation circuit 20 are included in a semiconductor IC 70. In other words, the switches 51 and 52, and the cancellation circuit 20 are integrated into a single chip.

The semiconductor IC 70 is an example of a first integrated circuit and is composed of, for example, a complementary metal oxide semiconductor (CMOS) and may be specifically manufactured using a silicon on insulator (SOI) process. The semiconductor IC 70 is not limited to CMOS.

The variable capacitors 21 and 22 that constitute the cancellation circuit 20 may be digitally tunable capacitors (DTC).

According to the above-described configuration, for example, the capacitors and inductors that constitute the cancellation circuit 20 are formed in the switch IC, in which the switches 51 and 52 are formed. Thus, the radio-frequency circuit 1B can be further reduced in size.

In the radio-frequency circuit 1B according to this variation, one of the cancellation circuits 20A through 20D listed in FIGS. 3B through 3E may be applied instead of the cancellation circuit 20. In this case, the variable capacitors 21 and 22 may be formed in the semiconductor IC 70, and the variable inductors 23, 26, and 27 may be formed outside the semiconductor IC 70.

1.5 Configuration of Radio-Frequency Circuit 1C According to Example

Next, a configuration and bandpass characteristics of a radio-frequency circuit 1C according to an example will be described.

Figure 5A:
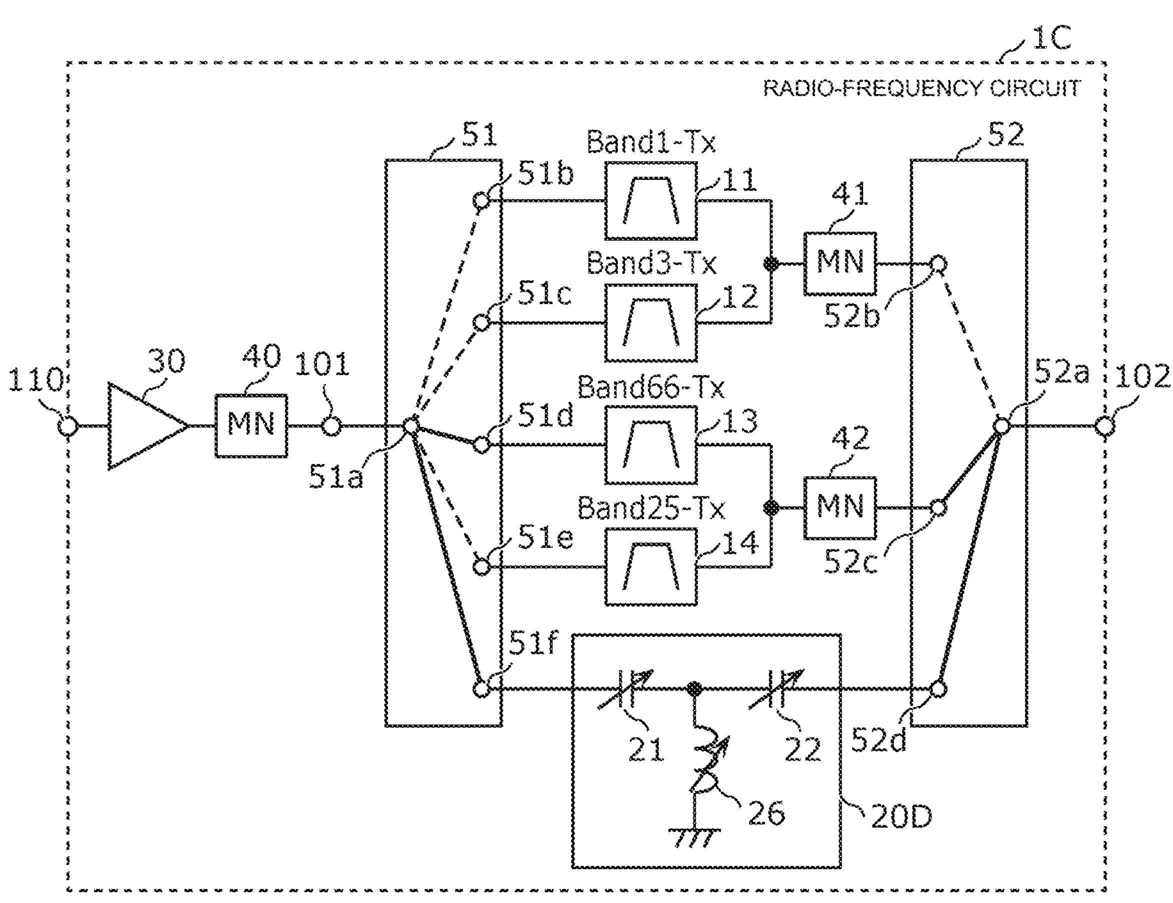
FIG. 5A is a diagram of a circuit configuration of the radio-frequency circuit according to an example of the first embodiment.

FIG. 5A is a diagram of a circuit configuration of the radio-frequency circuit 1C according to an example of the first embodiment. As illustrated in the diagram, the radio-frequency circuit 1C is provided with the filters 11, 12, 13, and 14, the switches 51 and 52, a cancellation circuit 20D, the power amplifier 30, the matching circuit 40, the common terminals 101 and 102, and the signal input terminal 110. The radio-frequency circuit 1C according to the example differs from the radio-frequency circuit 1A according to the first variation in that a specific band is applied as the pass band of the filters 11 to 14 and that the cancellation circuit 20D having a specific circuit configuration is applied as the cancellation circuit. The following describes the radio-frequency circuit 1C according to the example with a focus on the different configurations, while omitting descriptions of the same configurations of the radio-frequency circuit 1A according to the first variation.

The filter 11 is an example of the first bandpass filter, is connected to the common terminals 101 and 102, and has a first pass band that includes the uplink operating band of Band A. The filter 12 is an example of the second bandpass filter, is connected to the common terminals 101 and 102, and has a second pass band that includes the uplink operating band of Band B. The filter 13 is connected to the common terminals 101 and 102 and has a third pass band that includes the uplink operating band of Band C. The filter 14 is connected to the common terminals 101 and 102 and has a fourth pass band that includes the uplink operating band of Band D.

In the example, each of the bands A to D refers to a frequency band that is defined in advance, for example, by a standardization organization (such as 3GPP (registered trademark: 3rd Generation Partnership Project), IEEE (Institute of Electrical and Electronics Engineers), or the like) for a communication system built using radio access technology (RAT). In the example, the communication systems that can be used include, for example, 4G (4th Generation)-LTE (Long Term Evolution) systems, 5G (5th Generation)-NR (New Radio) systems, and WLAN (Wireless Local Area Network) systems but are not limited to these.

Band A is, for example, Band B1 for LTE (uplink operating band: 1920-1980 MHz, downlink operating band: 2110-2170 MHZ).

Band B is, for example, Band B3 for LTE (uplink operating band: 1710-1785 MHZ, downlink operating band: 1805-1880 MHZ).

Band C is, for example, Band B66 for LTE (uplink operating band: 1710-1780 MHZ, downlink operating band: 2110-2200 MHZ).

Band D is, for example, Band B25 for LTE (uplink operating band: 1850-1915 MHz, downlink operating band: 1930-1995 MHz).

The cancellation circuit 20D is provided with the variable capacitors 21 and 22 and the variable inductor 26, having a connection configuration illustrated in FIG. 3E.

In the radio-frequency circuit 1C according to the example, for example, assuming transmitting a radio-frequency signal in the uplink operating band of Band C, the terminal 51*a* and the terminal 51*d* are connected in the switch 51, and the terminal 52*a* and the terminal 52*c* are connected in the switch 52. At the same time, terminal 51*a* and the terminal 51*f* are connected in the switch 51, and the terminal 52*a* and the terminal 52*d* are connected in the switch 52. In other words, assuming transmitting radio-frequency signals in the uplink operating band of Band C, the filter 13 and the cancellation circuit 20D are connected in parallel between the common terminals 101 and 102. The terminals 51*a* and 51*f* may be connected at all times, and the terminals 52*a* and 52*d* may be connected at all times.

Figure 5B:
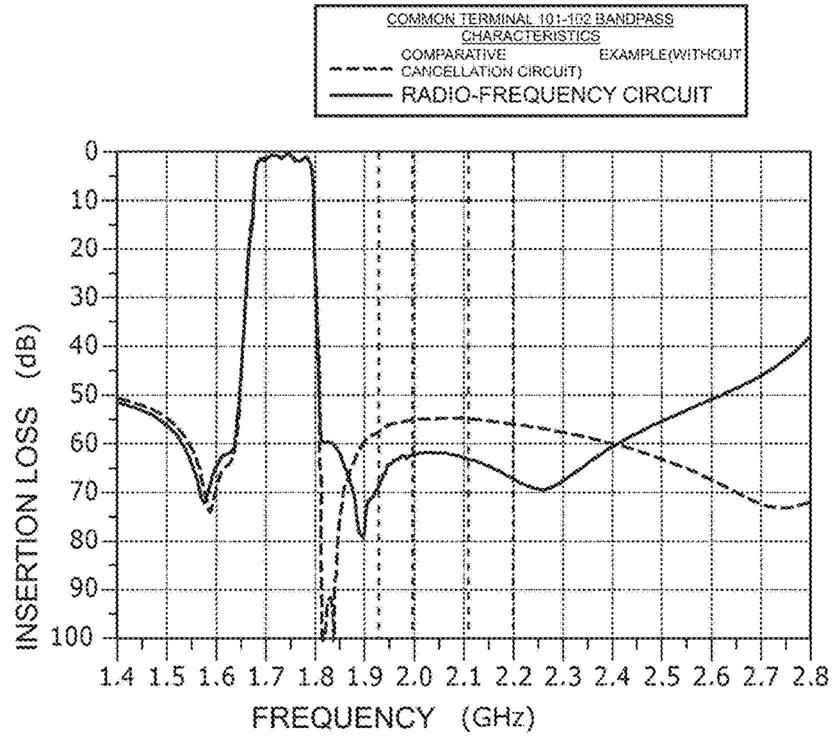
FIG. 5B is a graph illustrating the bandpass characteristics of the radio-frequency circuit according to the example of the first embodiment and a radio-frequency circuit according to a comparative example.

FIG. 5B is a graph illustrating the bandpass characteristics of the radio-frequency circuits according to the example of the first embodiment and a radio-frequency circuit according to a comparative example. The radio-frequency circuit according to the comparative example has a circuit configuration in which the cancellation circuit 20D may not be arranged in the radio-frequency circuit 1C according to the example. As illustrated in the diagram, there are a few differences between the radio-frequency circuit 1C according to the example and the radio-frequency circuit according to the comparative example in terms of the pass band in the bandpass characteristics from the common terminal 101 to the common terminal 102. In contrast, in the attenuation band (1900-2300 MHZ) on the higher frequency side than the pass band, the amount of attenuation in the radio-frequency circuit 1C according to the example is greatly improved compared to the radio-frequency circuit according to the comparative example.

This is due to the fact that the capacitance value of the variable capacitor 21 (first capacitance value), the capacitance value of the variable capacitor 22 (second capacitance value), and the inductance value of the variable inductor 26 (first inductance value) are adjusted in the cancellation circuit 20D, which generates a signal component in a phase substantially opposite to the component in the specified frequency band (1900-2300 MHZ) of the radio-frequency signal passing through the filter 13 at the common terminal 102.

Assuming any of the filters 11, 12, and 14 are connected to the common terminals 101 and 102 instead of the filter 13, the cancellation circuit 20D newly adjusts the capacitance value of the variable capacitor 21 (third capacitance value), the capacitance value of the variable capacitor 22 (fourth capacitance value), and the inductance value of the variable inductor 26 (second inductance value). As a result, a signal component having a phase substantially opposite to the component in the predetermined frequency band of the radio-frequency signal that passes through one of the filters 11, 12, and 14 is generated in the cancellation circuit 20D at the common terminal 102.

1.6 Configuration of Radio-Frequency Circuit 1D According to Seventh Variation Next, a configuration of a radio-frequency circuit 1D according to a seventh variation will be described.

Figure 6:
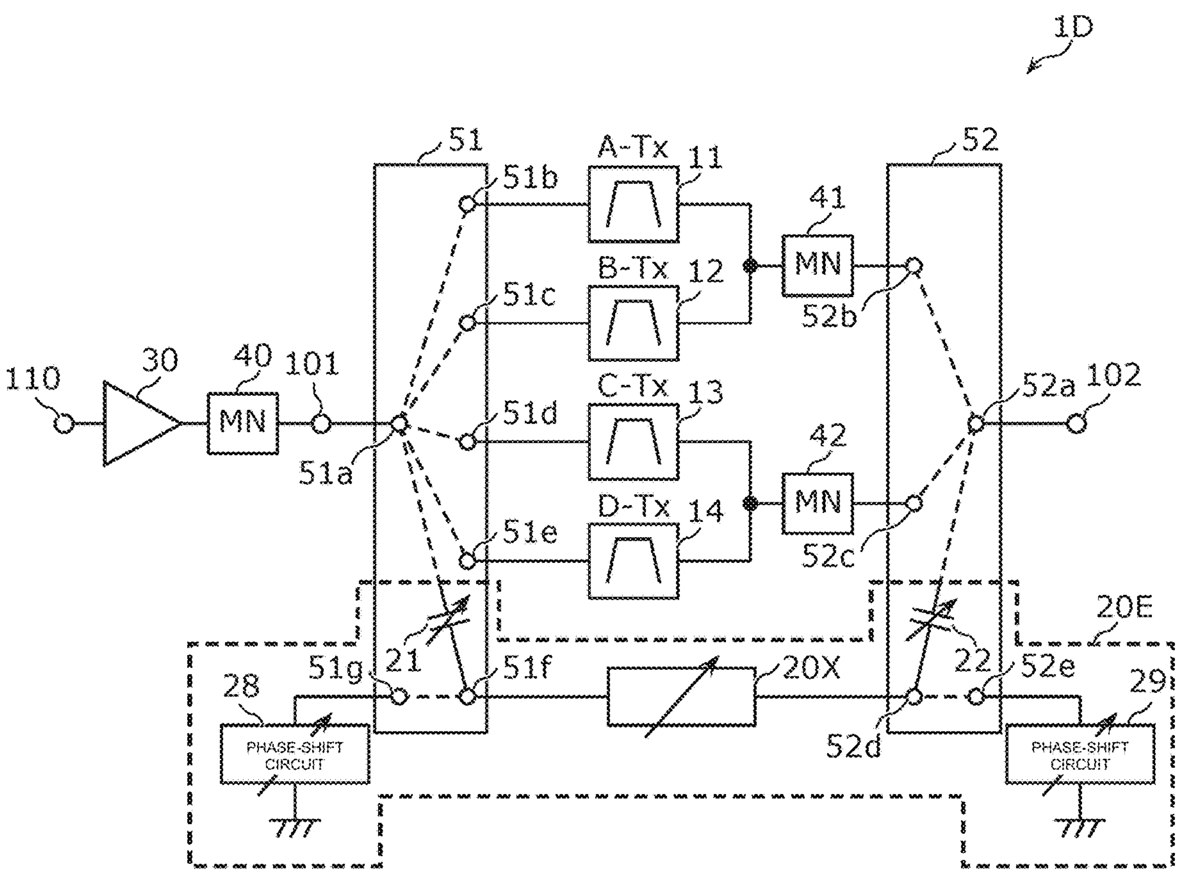
FIG. 6 is a diagram of a circuit configuration of a radio-frequency circuit according to a seventh variation of the first embodiment.

FIG. 6 is a diagram of a circuit configuration of the radio-frequency circuit 1D according to the seventh variation of the first embodiment. As illustrated in the diagram, the radio-frequency circuit 1D is provided with the filters 11, 12, 13, and 14, the switches 51 and 52, a cancellation circuit 20E, the power amplifier 30, the matching circuits 40, 41, and 42, the common terminals 101 and 102, and the signal input terminal 110. The radio-frequency circuit 1D according to this variation differs from the radio-frequency circuit 1A according to the first variation in the configuration of the cancellation circuit 20E. The following describes the radio-frequency circuit 1D according to this variation with a focus on the different configurations, while omitting descriptions of the same configurations of the radio-frequency circuit 1A according to the first variation.

The switch 51 is an example of the first switch and is disposed between the common terminal 101 and the filters 11 to 14 and the cancellation circuit 20E. The switch 51 has the terminals 51*a*, 51*b*, 51*c*, 51*d*, 51*e*, 51*f*, and 51*g*, and switches the connection between the terminal 51*a* and at least one of the terminals 51*b* to 51*f*, and the connection and disconnection between the terminal 51*f* and the terminal 51*g*. The terminal 51*a* is connected to the common terminal 101, the terminal 51*b* is connected to the input end of the filter 11, the terminal 51*c* is connected to the input end of the filter 12, the terminal 51*d* is connected to the input end of the filter 13, the terminal 51*e* is connected to the input end of the filter 14, the terminal 51*f* is connected to one end of the phase adjuster 20X and the variable capacitor 21, and the terminal 51*g* is connected to a phase-shift circuit 28. The terminal 51*f* may be connected to the terminal 51*a* at all times via the variable capacitor 21.

The switch 52 is an example of the second switch and is disposed between the common terminal 102 and the filters 11 to 14 and the cancellation circuit 20E. The switch 52 has the terminals 52*a*, 52*b*, 52*c*, 52*d*, and 52*e*, and switches the connection between the terminal 52*a* and at least one of the terminals 52*b* to 52*d*, and the connection and disconnection between the terminal 52*d* and the terminal 52*e*. The terminal 52*a* is connected to the common terminal 102, the terminal 52*b* is connected to the output end of the filter 11 and the output end of the filter 12 via the matching circuit 41, the terminal 52*c* is connected to the output end of the filter 13 and the output end of the filter 14 via the matching circuit 42, the terminal 52*d* is connected to the other end of the phase adjuster 20X and the variable capacitor 22, and the terminal 52*e* is connected to a phase-shift circuit 29. The terminal 52*d* may be connected to the terminal 52*a* at all times via the variable capacitor 22.

The cancellation circuit 20E is provided with the variable capacitors 21 and 22, the phase adjuster 20*x*, and the phase-shift circuits 28 and 29.

The variable capacitor 21 is connected between the terminals 51*a* and 51*f*. The variable capacitor 22 is connected between the terminals 52*a* and 52*d*.

The phase adjuster 20X is connected between the terminals 51*f* and 52*d* and is capable of adjusting the phase of the radio-frequency signal passing through the cancellation circuit 20E. The circuit configuration of the phase adjuster 20X is, for example, one of the circuit configurations listed in FIGS. 3A through 3E.

The phase-shift circuit 28 is an example of a first phase-shift circuit, connected between the terminal 51*g* and the ground, and capable of shifting the phase of the radio-frequency signal passing through the cancellation circuit 20E depending on which of the filters 11 to 14 is connected to the common terminals 101 and 102. The phase-shift circuit 29 is an example of a second phase-shift circuit, connected between the terminal 52*e* and the ground, and capable of shifting the phase of the radio-frequency signal passing through the cancellation circuit 20E depending on which of the filters 11 to 14 is connected to the common terminals 101 and 102.

The phase-shift circuits 28 and 29 may or may not change the amount of phase shift depending on which of the filters 11 to 14 are connected to the common terminals 101 and 102. That is, they may have a fixed amount of phase shift.

According to the above-described configuration, the phase of the radio-frequency signal passing through the cancellation circuit 20E can be shifted by switching the connection and disconnection between the terminals 51*f* and 51*g* and between the terminals 52*d* and 52*e*, depending on which of filters 11 to 14 are connected to the common terminals 101 and 102. Therefore, it is possible to shift the phase of the radio-frequency signal that passes through the cancellation circuit 20E. Therefore, it is possible to adjust the amount of phase shift of the cancellation circuit 20E with high precision.

1.7 Configuration of Radio-Frequency Circuit 1E According to Eighth Variation Next, a configuration of a radio-frequency circuit 1E according to an eighth variation is described.

Figure 7:
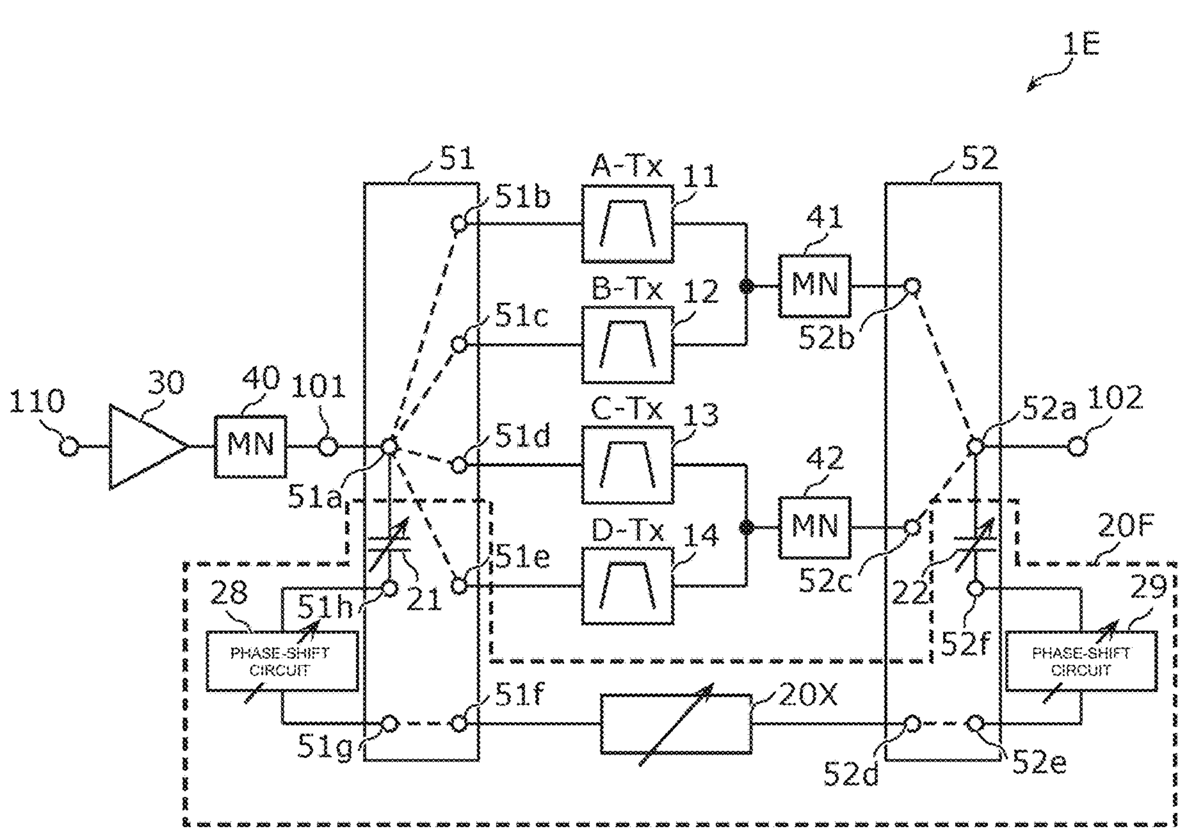
FIG. 7 is a diagram of a circuit configuration of a radio-frequency circuit according to an eighth variation of the first embodiment.

FIG. 7 is a diagram of a circuit configuration of the radio-frequency circuit 1E according to the eighth variation of the first embodiment. As illustrated in the diagram, the radio-frequency circuit 1E is provided with the filters 11, 12, 13, and 14, the switches 51 and 52, a cancellation circuit 20F, the power amplifier 30, the matching circuits 40, 41, and 42, the common terminals 101 and 102, and the signal input terminal 110. The radio-frequency circuit 1E according to this variation differs from the radio-frequency circuit 1D according to the seventh variation in the configuration of the cancellation circuit 20F. The following describes the radio-frequency circuit 1E according to this variation with a focus on the different configurations, while omitting descriptions of the same configurations of the radio-frequency circuit 1D according to the seventh variation.

The switch 51 is an example of the first switch and is disposed between the common terminal 101 and the filters 11 to 14 and the cancellation circuit 20F. The switch 51 has the terminals 51*a*, 51*b*, 51*c*, 51*d*, 51*e*, 51*f*, 51*g*, and 51*h*, and switches the connection between the terminal 51*a* and at least one of the terminals 51*b* to 51*e*, the connection between the terminals 51*f* and 51*g*, and the connection between the terminals 51*f* and 51*h*. The terminal 51*a* is connected to the common terminal 101 and one end of the variable capacitor 21, the terminal 51*b* is connected to the input end of the filter 11, the terminal 51*c* is connected to the input end of the filter 12, the terminal 51*d* is connected to the input end of the filter 13, the terminal 51*e* is connected to the input end of the filter 14, the terminal 51*f* is connected to one end of the phase adjuster 20*x*, the terminal 51*g* is connected to one end of the phase-shift circuit 28, and the terminal 51*h* is connected to the other end of the variable capacitor 21 and the other end of the phase-shift circuit 28. The terminals 51*a* and 51*h* may be connected at all times via the variable capacitor 21.

The switch 52 is an example of the second switch and is disposed between the common terminal 102 and the filters 11 to 14 and the cancellation circuit 20F. The switch 52 has the terminals 52*a*, 52*b*, 52*c*, 52*d*, 52*e*, and 52*f* and switches the connection between the terminal 52*a* and at least one of the terminals 52*b* and 52*c*, the connection between the terminals 52*d* and 52*e*, and the connection between the terminals 52*d* and 52*f*. The terminal 52*a* is connected to the common terminal 102 and one end of the variable capacitor 22, the terminal 52*b* is connected to the output end of the filter 11 and the output end of the filter 12 via the matching circuit 41, the terminal 52*c* is connected to the output end of the filter 13 and the output end of the filter 14 via the matching circuit 42, and the terminal 52*d* is connected to the other end of the phase adjuster 20*x*, the terminal 52*e* is connected to one end of the phase-shift circuit 29, and the terminal 52*f* is connected to the other end of the variable capacitor 22 and the other end of the phase-shift circuit 28. The terminals 52*a* and 52*f* may be connected at all times via the variable capacitor 22.

The cancellation circuit 20F is provided with the variable capacitors 21 and 22, the phase adjuster 20*x*, and the phase-shift circuits 28 and 29.

The variable capacitor 21 is connected between the terminals 51*a* and 51*h*. The variable capacitor 22 is connected between the terminals 52*a* and 52*f*.

The phase adjuster 20X is connected between the terminals 51*f* and 52*d* and is capable of adjusting the phase of the radio-frequency signal passing through the cancellation circuit 20F. The circuit configuration of the phase adjuster 20X is, for example, one of the circuit configurations listed in the FIGS. 3A through 3E.

The phase-shift circuit 28 is an example of the first phase-shift circuit, connected between the terminals 51*g* and 51*h*, and capable of shifting the phase of the radio-frequency signal passing through the cancellation circuit 20F depending on which of the filters 11 to 14 is connected to the common terminals 101 and 102. The phase-shift circuit 29 is an example of the second phase-shift circuit, connected between the terminals 52*e* and 52*f*, and capable of shifting the phase of the radio-frequency signal passing through the cancellation circuit 20F depending on which of the filters 11 to 14 is connected to the common terminals 101 and 102.

In the seventh variation, the phase-shift circuits 28 and 29 are connected (connected in shunt) between the path connecting the common terminal 101 and the ground and the path connecting the common terminal 102 and the ground, respectively. In contrast, in this variation, each of the phase-shift circuits 28 and 29 is disposed in series in the path connecting the common terminals 101 and 102.

The phase-shift circuits 28 and 29 may or may not change the amount of phase shift depending on which of the filters 11 to 14 is connected to the common terminals 101 and 102. That is, they may have a fixed amount of phase shift.

According to the above-described configuration, depending on which of the filters 11 to 14 is connected to the common terminals 101 and 102, by switching the connection between the terminals 51*f* and 51*g* and between the terminals 51*f* and 51*h*, and switching the connection between the terminals 52*d* and 52*e* and between the terminals 52*d* and 52*f*, the phase of the radio-frequency signal passing through the cancellation circuit 20F can be shifted. Therefore, it is possible to adjust the amount of phase shift of the cancellation circuit 20F with high precision.

1.8 Effects

As described above, the radio-frequency circuit 1 according to the present embodiment is provided with the common terminals 101 and 102, the filter 11 connected to the common terminals 101 and 102 and having the first pass band, the filter 12 connected to the common terminals 101 and 102 and having the second pass band, and the cancellation circuit 20 connected to the common terminals 101 and 102, connected in parallel with the filters 11 and 12, and configured to vary at least one of an amplitude and a phase in the bandpass characteristics.

According to this, the frequency bandwidth of the radio-frequency signal transmitted through the radio-frequency circuit 1 determines the path (through which of the filters 11 and 12 the radio-frequency signal passes) that transmits the radio-frequency signal. The bandpass characteristics of the filters 11 and 12 can be improved by varying the bandpass characteristics of the cancellation circuit 20 according to the frequency bandwidth of the radio-frequency signal (depending on which of the paths of the filters 11 and 12 the above radio-frequency signal passes through). In addition, since one cancellation circuit 20 is shared by a plurality of filters without adding a cancellation circuit to each of the filters 11 and 12, the compact radio-frequency circuit 1 with improved transmission characteristics of radio-frequency signals can be provided.

Further, for example, the radio-frequency circuit 1 according to the present embodiment is further provided with the power amplifier 30 connected to the common terminal 101, and the common terminal 101 is connected to the antenna 2.

This allows the radio-frequency circuit 1 to transmit signals in a plurality of frequency bands.

Further, for example, in addition to the components of the radio-frequency circuit 1, the radio-frequency circuit 1A according to the first variation of the present embodiment is provided with the switch 51 disposed between the common terminals 101, the filters 11, 12 and the cancellation circuit 20, and the switch 52 disposed between the common terminal 102, the filters 11, 12 and the cancellation circuit 20.

According to this, the path (through which of the filters 11 and 12 through the radio-frequency signal passes) for transmitting the radio-frequency signals is selected by switching the connection by the switches 51 and 52 according to the frequency band of the radio-frequency signals transmitted through the radio-frequency circuit 1A. This improves the isolation characteristics between the filters 11 and 12. Also, by varying the bandpass characteristics of the cancellation circuit 20 in response to the switching of the switches 51 and 52, the bandpass characteristics of the filters 11 and 12 can be improved. In addition, since one cancellation circuit 20 is shared by a plurality of filters without adding a cancellation circuit to each of the filters 11 and 12, the compact radio-frequency circuit 1A with improved transmission characteristics of radio-frequency signals can be provided.

Further, for example, in the radio-frequency circuit 1A according to the first variation, the cancellation circuits 20, 20A, 20B, 20C, and 20D is provided with at least one of the variable capacitor 21 disposed in the path connecting the common terminal 101 and the switch 52, and the variable capacitor 22 disposed in the path connecting the common terminal 102 and the switch 51.

According to this, the amplitude of the radio-frequency signal passing through the cancellation circuits 20 to 20D can be adjusted.

Further, for example, in the radio-frequency circuit 1 according to the present embodiment and in the radio-frequency circuit 1A according to the first variation, the at least one of the variable capacitors 21 and 22 is a DTC.

This allows the cancellation circuits 20 to 20D to be reduced in size.

Further, for example, in the radio-frequency circuit 1A according to the first variation, assuming one common terminal 101, the filter 11, and the common terminal 102 are connected by switching the connection of the switches 51 and 52, the common terminal 101, the cancellation circuit 20, and the common terminal 102 are connected, the capacitance value of the variable capacitor 21 becomes the first capacitance value and the capacitance value of the variable capacitor 22 becomes the second capacitance value. Assuming the common terminal 101, the filter 12, and the common terminal 102 are connected by switching the connection of the switches 51 and 52, the common terminal 101, the cancellation circuit 20, and the common terminal 102 are connected, the capacitance value of the variable capacitor 21 becomes the third capacitance value different from the first capacitance value, and the capacitance value of the variable capacitor 22 becomes the fourth capacitance value different from the second capacitance value.

According to this, the variable capacitors 21 and 22 have variable capacitance values depending on which of the filters 11 and 12 the radio-frequency signal passes through. Thus, a single cancellation circuit 20 can improve the bandpass characteristics of the filters 11 and 12 and enable reduction in size.

Further, for example, the cancellation circuits 20 and 20C are further provided with the variable inductor 23 connected to the variable capacitors 21 and 22.

This allows the phase of the radio-frequency signals passing through the cancellation circuits 20 and 20C to be adjusted.

Further, for example, the cancellation circuits 20A and 20D are further provided with the variable inductor 26 connected between the path connecting the variable capacitors 21 and 22 and the ground.

This allows the phase of the radio-frequency signals passing through the cancellation circuits 20A and 20D to be adjusted.

Further, for example, in the radio-frequency circuit 1D according to the seventh variation and the radio-frequency circuit 1E according to the eighth variation, the cancellation circuits 20E and 20F are further provided with at least one of the phase-shift circuit 28 connected to the switch 51 and the phase-shift circuit 29 connected to the switch 52.

According to this, it is possible to shift the phase of the radio-frequency signal passing through the cancellation circuits 20E or 20F by switching the connection of the switches 51 and 52 depending on which of the filters 11 and 12 are connected to the common terminals 101 and 102. Therefore, the amount of phase shift of the cancellation circuits 20E and 20F can be adjusted with high precision.

Further, for example, in the radio-frequency circuit 1B according to the sixth variation, the switches 51 and 52 and the cancellation circuit 20 are included in the semiconductor IC 70.

According to this, the radio-frequency circuit 1B can be reduced in size.

Further, for example, in the bandpass characteristics of the cancellation circuits of the radio-frequency circuits 1, 1A, 1B, 1C, 1D, and 1E, the insertion loss is 10 dB or more over a frequency range from the DC to three times the frequency of the high frequency end of the high frequency side out of the high frequency end of the first pass band and the high frequency end of the second pass band.

According to this, the above-described cancellation circuit functions not as a filter circuit, but as a variable attenuator that attenuates the desired frequency band of the filters 11 and 12.

Further, for example, in the radio-frequency circuits 1, 1A, 1B, 1C, 1D, and 1E, no bandpass filter is connected to the path connecting the common terminal 101, the cancellation circuit, and the common terminal 102.

Further, for example, in the radio-frequency circuits 1, 1A, 1B, 1C, 1D, and 1E, no acoustic wave filter is connected to the path connecting the common terminal 101, the cancellation circuit and the common terminal 102.

The communication device 4 according to the present embodiment is provided with the RFIC 3 that processes radio-frequency signals and the radio-frequency circuit 1 that transmits radio-frequency signals between the RFIC 3 and the antenna 2.

According to this, the effect of the radio-frequency circuit 1 can be realized in the communication device 4.

Embodiment 2

Configuration of Radio-Frequency Circuit and Communication Device

Figure 8:
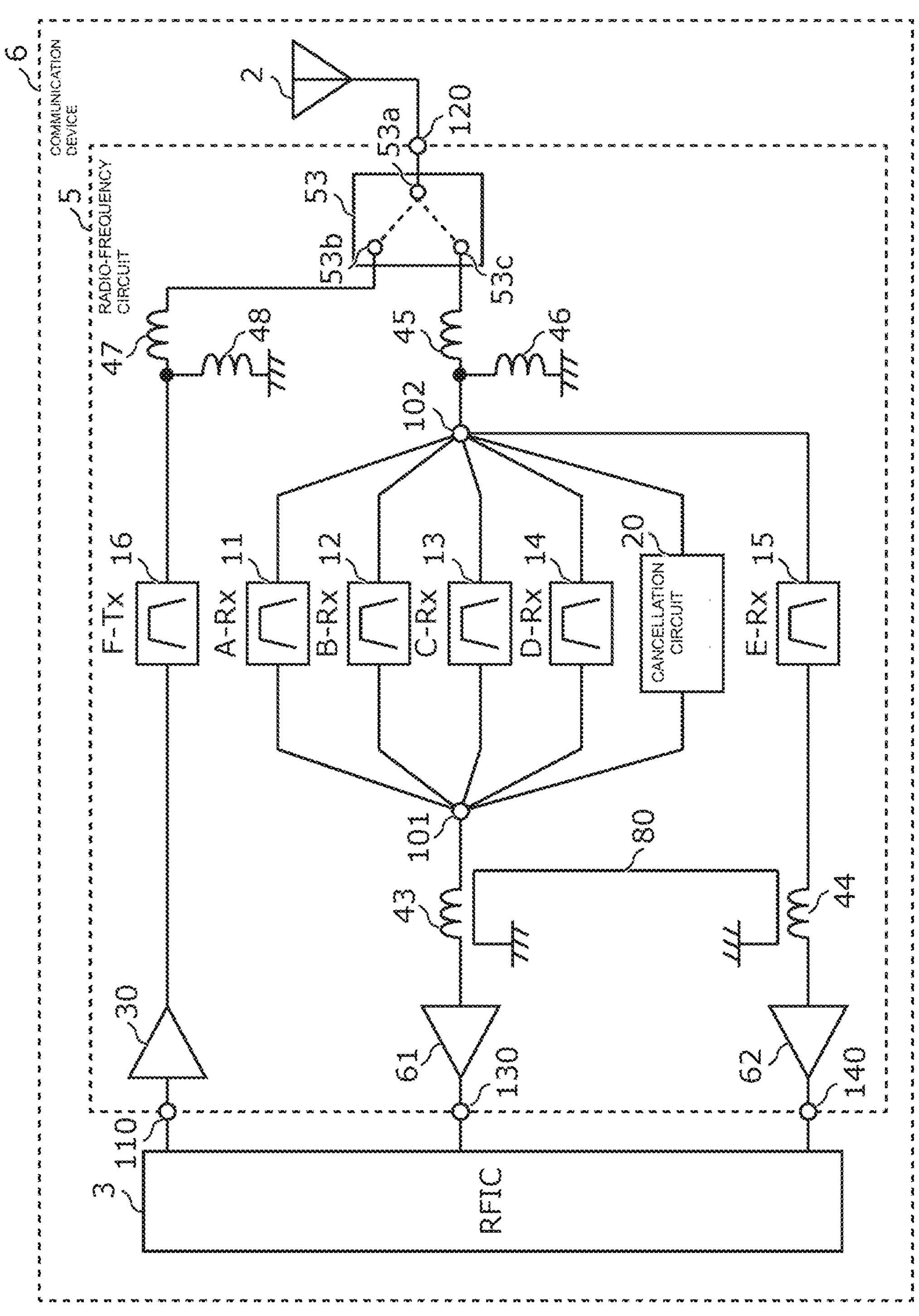
FIG. 8 is a diagram of a circuit configuration of a radio-frequency circuit and a communication device according to a second embodiment.

A circuit configuration of a radio-frequency circuit 5 and a communication device 6 according to the present embodiment will be described with reference to FIG. 8. FIG. 8 is a diagram of a circuit configuration of the radio-frequency circuit 5 and the communication device 6 according to the second embodiment.

2.1 Circuit Configuration of Communication Device 6

First, the circuit configuration of the communication device 6 is described. As illustrated in FIG. 8, the communication device 6 according to the present embodiment is provided with the radio-frequency circuit 5, the antenna 2, and the RFIC 3.

The radio-frequency circuit 5 transmits radio-frequency signals between the antenna 2 and the RFIC 3. The detailed circuit configuration of the radio-frequency circuit 5 will be described below.

The antenna 2 and the RFIC 3 have the same functions and configurations as those of the antenna 2 and the RFIC 3 provided in the communication device 4 according to the first embodiment, so descriptions thereof are omitted.

2.2 Circuit Configuration of Radio-Frequency Circuit 5

Next, the circuit configuration of the radio-frequency circuit 5 will be described. As illustrated in FIG. 8, the radio-frequency circuit 5 is provided with the filters 11, 12, 13, 14, 15 and 16, the cancellation circuit 20, the power amplifier 30, low-noise amplifiers 61 and 62, inductors 43, 44, 45, 46, 47, and 48, a ground conductor 80, a switch 53, the common terminals 101 and 102, the signal input terminal 110, an antenna connection terminal 120, and signal output terminals 130 and 140.

The signal input terminal 110 is connected to the RFIC 3 and the power amplifier 30. The signal output terminal 130 is connected to the RFIC 3 and the low-noise amplifier 61. The signal output terminal 140 is connected to the RFIC 3 and the low-noise amplifier 62. The antenna connection terminal 120 is connected to the switch 53 and the antenna 2.

The common terminal 101 is an example of the first common terminal and is connected to the input end of the filter 11, the input end of the filter 12, the input end of the filter 13, the input end of the filter 14, one end of the cancellation circuit 20, and one end of the inductor 43.

The common terminal 102 is an example of the second common terminal and is connected to the output end of the filter 11, the output end of the filter 12, the output end of the filter 13, the output end of the filter 14, the other end of the cancellation circuit 20, and one end of inductor 45.

The filter 11 is an example of the first bandpass filter, is connected to the common terminals 101 and 102, and has a first pass band that includes the downlink operating band of Band A. The filter 12 is an example of the second bandpass filter, is connected to the common terminals 101 and 102, and has a second pass band that includes the downlink operating band of Band B. The filter 13 is connected to the common terminals 101 and 102 and has a third pass band that includes the downlink operating band of Band C. The filter 14 is connected to the common terminals 101 and 102 and has a fourth pass band that includes the downlink operating band of band D. The filter 15 is an example of the third bandpass filter, is connected to the inductor 44 and the common terminal 102, and has a fifth pass band that includes the downlink operating band of band E. The filter 16 is connected to the power amplifier 30 and the inductor 47 and has a sixth pass band that includes the uplink operating band of band F.

The cancellation circuit 20 is connected to the common terminals 101 and 102, is connected in parallel with the filters 11 to 14, and is configured to have at least one of an amplitude and a phase variable in the bandpass characteristics.

The low-noise amplifier 61 is an example of the first amplifier, and its input terminal is connected to the common terminal 101 via the inductor 43. The low-noise amplifier 62 is an example of a second amplifier, and its input terminal is connected to the common terminal 102 via the inductor 44 and the filter 15.

The inductor 43 is an example of a third inductor and is disposed in series in the path connecting the low-noise amplifier 61 and the common terminal 101. The inductor 44 is an example of a fourth inductor and is disposed in series in the path connecting the low-noise amplifier 61 and the filter 15.

The ground conductor 80 is disposed adjacent to the inductors 43 and 44 and is capacitively and/or inductively coupled to the inductor 43 and capacitively and/or inductively coupled to the inductor 44.

The power amplifier 30 is connected to the filter 16.

The switch 53 has the terminals 53*a*, 53*b* and 53*c* and connects the terminal 53*a* to at least one of the terminals 53*b* and 53*c*. The terminal 53*a* is connected to the antenna connection terminal 120, the terminal 53*b* is connected to the inductor 47, and the terminal 53*c* is connected to the inductor 45.

The inductor 45 is connected between the common terminal 102 and the terminal 53*c*. The inductor 46 is connected between the path connecting the common terminal 102 and the switch 53, and the ground. The inductors 45 and 46 constitute an impedance matching circuit. The inductor 47 is connected between the filter 16 and the terminal 53*b*. The inductor 48 is connected between the path connecting the filter 16 and the switch 53, and the ground. The inductors 47 and 48 constitute an impedance matching circuit.

In the radio-frequency circuit 5 according to the present embodiment, the power amplifier 30, the filters 13, 14 and 16, the inductors 45 to 48 and the switch 53 may be omitted.

Figure 9:
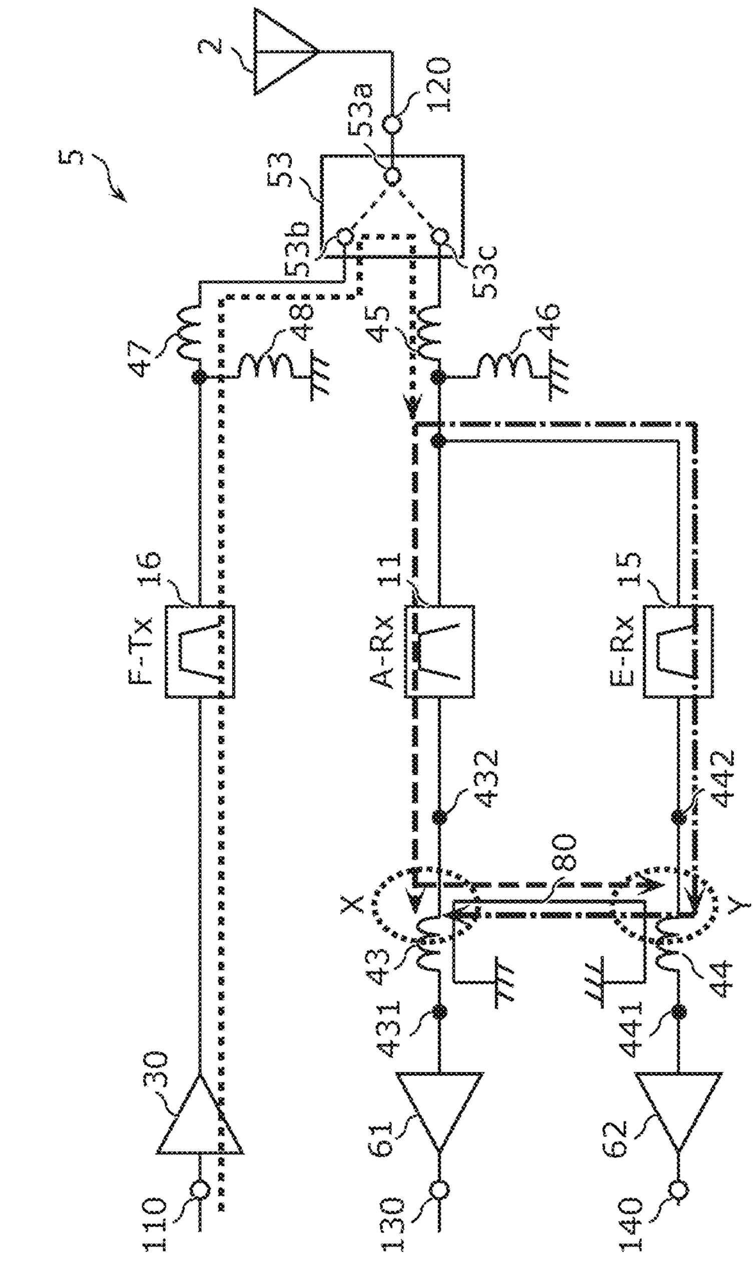
FIG. 9 is a diagram illustrating the state of suppression of unwanted wave signals in the radio-frequency circuit according to the second embodiment.

FIG. 9 is a diagram illustrating the state of suppression of unwanted wave components in the radio-frequency circuit 5 according to the second embodiment. The diagram illustrates a part of the radio-frequency circuit 5 and the state in which unwanted wave components are suppressed.

As illustrated in the diagram, it is assumed that the band F transmission signal or its harmonic wave components (hereinafter referred to as unwanted wave components) that have passed through the power amplifier 30 and the filter 16, enter the first reception path where the filter 11 and the low-noise amplifier 61 are disposed, and the second reception path where the filter 15 and the low-noise amplifier 62 are disposed, via the switch 53. Here, assuming the reception signal of band A, the reception signal of band E, and the transmission signal of band F are transmitted simultaneously, it is assumed that the above-described unwanted wave components are amplified by the low-noise amplifiers 61 and 62, resulting in a decrease in the reception sensitivity of the reception signals of band A and band E.

In contrast, according to the above-described configuration of the radio-frequency circuit 5 according to the present embodiment, the inductor 43 is capacitively and/or inductively coupled to the ground conductor 80, and the inductor 44 is capacitively and/or inductively coupled to the ground conductor 80. According to this, the inductor 43 and the inductor 44 are weakly ground-coupled. Therefore, the unwanted wave components that pass through the filter 11 and the unwanted wave components that pass through the filter 15 can be canceled out at the coupling portion between the inductor 43 and the ground conductor 80 (X in FIG. 9) and also at the coupling portion between the inductor 44 and the ground conductor 80 (Y in FIG. 9). In other words, the above-described unwanted wave components can be suppressed only by disposing the ground conductor 80 between the two transmission paths, thus providing a compact radio-frequency circuit 5 with improved radio-frequency signal transmission characteristics.

The inductors 43 and 44 may be constituted by a chip inductor element, a planar coil formed within a multilayer substrate, or a conductor wire.

The source of unwanted wave components is not limited to the transmission signal transmitted through the radio-frequency circuit 5, but may also be transmission signals and reception signals that enter from a circuit different from the radio-frequency circuit 5.

2.3 Mounting Configuration of Radio-Frequency Circuit 5

Next, a mounting configuration of the radio-frequency circuit 5 will be described.

Figure 10:
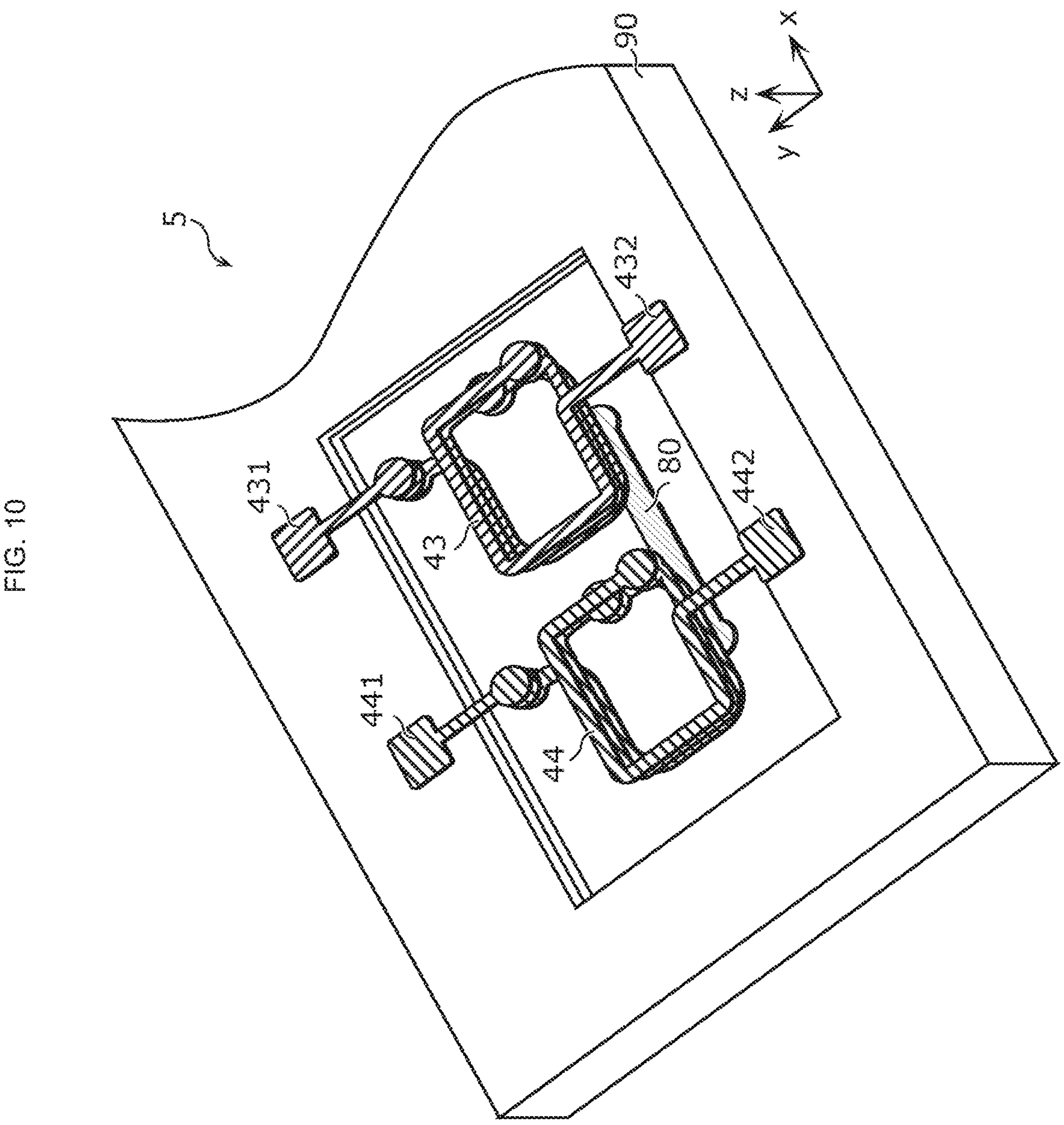
FIG. 10 is a perspective view of a part of the radio-frequency circuit according to the second embodiment.

FIG. 10 is a perspective view illustrating a part of the radio-frequency circuit 5 according to the second embodiment. The diagram illustrates the arrangement relationship between the inductors 43 and 44 provided in the radio-frequency circuit 5 and the ground conductor 80. As illustrated in the diagram, the radio-frequency circuit 5 is provided with a substrate 90.

The substrate 90 has a first main surface and a second main surface facing each other and is a substrate on which the circuit components constituting the radio-frequency circuit 5 are mounted. The substrate 90 that can be used is, for example, a Low Temperature Co-fired Ceramics (LTCC) substrate having a stacked structure of multiple dielectric layers, a High Temperature Co-fired Ceramics (HTCC) substrate, a substrate with built-in components, a substrate with a redistribution layer (RDL), and a printed circuit board.

Each of the inductors 43 and 44 is constituted by a planar coil formed in or on the substrate 90. Specifically, the inductors 43 and 44 have a configuration in which a plurality of planar coils formed on different layers are connected by via conductors. The planar coils are formed along a direction parallel to the first main surface and the second main surface of the substrate 90. In FIG. 10, to illustrate the state of formation of the inductors 43 and 44, it appears that a recess is formed in the first main surface of the substrate 90, but in reality, the recess is filled with a member constituting the substrate 90. One end 432 and the other end 431 of the inductor 43 are disposed as electrode pads on the first main surface of the substrate 90. One end 442 and the other end 441 of the inductor 44 are disposed as electrode pads on the first main surface of the substrate 90.

The ground conductor 80 is a planar conductor formed on a layer different from the layer on which the inductors 43 and 44 are formed and is connected to the ground. As for the ground conductor 80, assuming the first main surface of the substrate 90 is viewed in plan view, the inductor 43 partially overlaps the ground conductor 80, and the inductor 44 partially overlaps the ground conductor 80.

According to this, the inductor 43 is capacitively and/or inductively coupled to the ground conductor 80, and the inductor 44 is capacitively and/or inductively coupled to the ground conductor 80. In other words, the inductor 43 and the inductor 44 are weakly ground-coupled. As a result, by only disposing the ground conductor 80 between the reception paths including the inductor 43 and the inductor 44, unwanted wave components entering the two reception paths can be suppressed, and a compact radio-frequency circuit 5 with improved radio-frequency signal transmission characteristics can be provided.

The filters 11 to 16, the cancellation circuit 20, the power amplifier 30, the low-noise amplifiers 61 and 62, the switch 53, and the inductors 45 to 48 may be disposed on the substrate 90 or on a different substrate than the substrate 90.

In the embodiment, each of the inductors 43 and 44 is constituted by a planar coil formed in or on substrate 90, but they may also be surface-mounted chip inductors mounted on the first main surface of the substrate 90. Also in this case, it is sufficient that, as for the ground conductor 80, assuming the first main surface of the substrate 90 is viewed in plan view, the inductor 43 overlaps a part of the ground conductor 80 and the inductor 44 overlaps a part of the ground conductor 80.

2.4 Mounting Configuration of Radio-Frequency Circuit 5A According to First Variation Next, a mounting configuration of a radio-frequency circuit 5A according to the first variation will be described.

Figure 11:
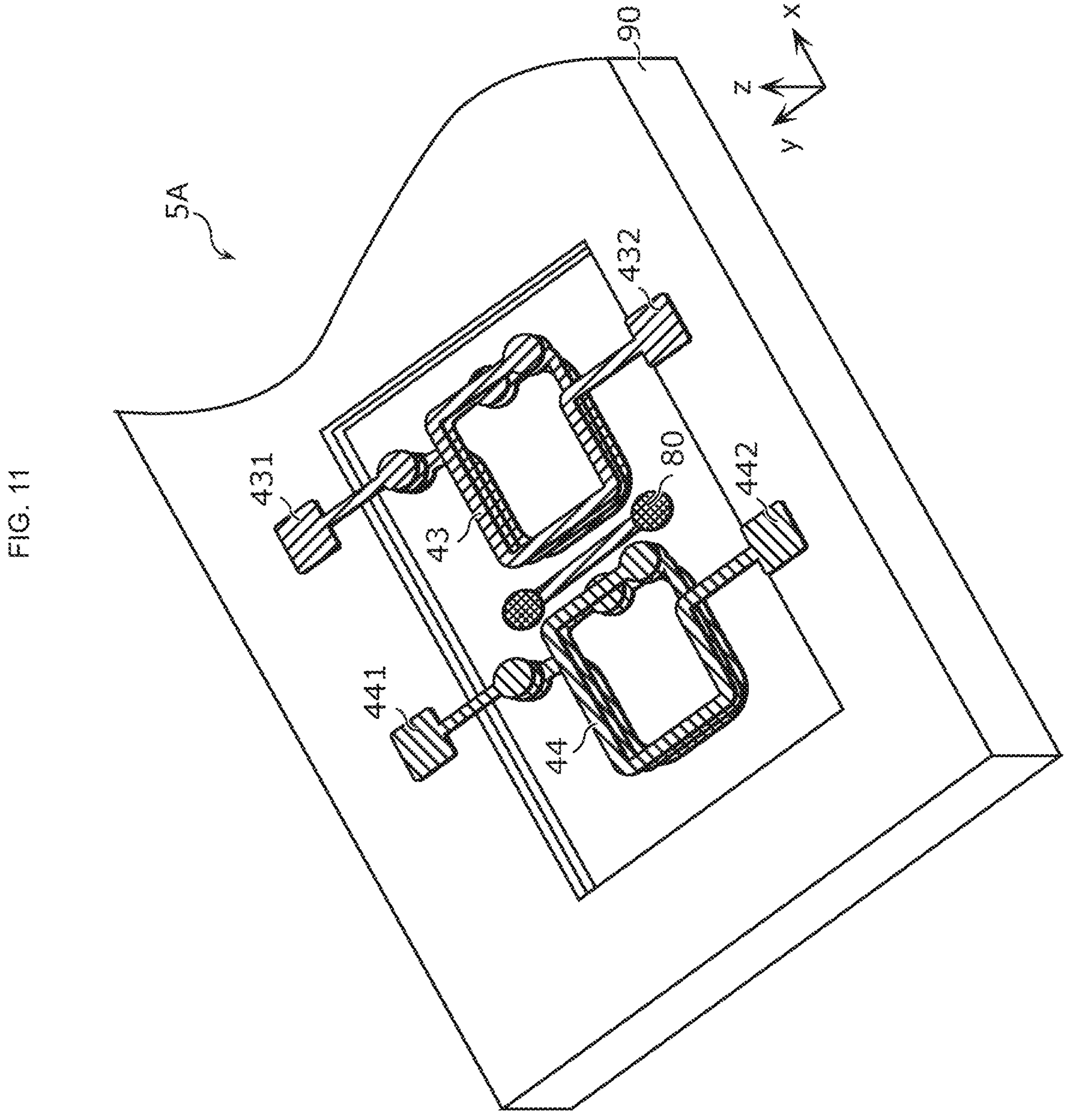
FIG. 11 is a perspective view of a part of a radio-frequency circuit according to a first variation of the second embodiment.

FIG. 11 is a diagram illustrating a part of the radio-frequency circuit 5A according to the first variation of the second embodiment. The diagram illustrates the arrangement relationship between the inductors 43 and 44 provided in the radio-frequency circuit 5A and the ground conductor 80. As illustrated in the diagram, the radio-frequency circuit 5A is provided with a substrate 90. The radio-frequency circuit 5A according to the variation differs from the radio-frequency circuit 5 according to the second embodiment in the configuration arrangement of the ground conductor 80. The following describes the radio-frequency circuit 5A according to the variation with a focus on the description of different configurations, while omitting descriptions of the same configurations of the radio-frequency circuit according to the second embodiment.

The ground conductor 80 is a planar conductor formed on the same layer as the layer on which the inductors 43 and 44 are formed, and is connected to the ground. The ground conductor 80 is disposed adjacent to the inductors 43 and 44 assuming the first main surface of the substrate 90 is viewed in plan view.

According to this, the inductor 43 is capacitively and/or inductively coupled to the ground conductor 80, and the inductor 44 is capacitively and/or inductively coupled to the ground conductor 80. In other words, the inductor 43 and the inductor 44 are weakly ground-coupled. As a result, by simply disposing the ground conductor 80 between the reception paths including the inductor 43 and the inductor 44, unwanted wave components entering the two reception paths can be suppressed, and a compact radio-frequency circuit 5A with improved radio-frequency signal transmission characteristics can be provided.

In the second embodiment and its first variation, the ground conductor 80 is set to a weak ground potential. Specifically, the strength of the ground potential of the ground conductor 80 is defined, for example, by the number of ground via conductors connected to the ground conductor 80.

Figure 12A:
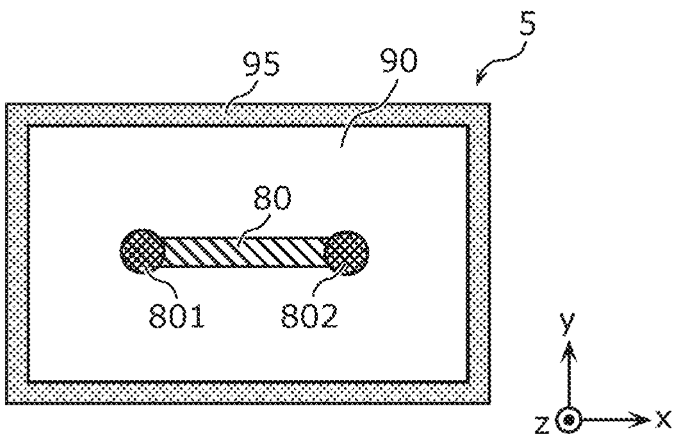
FIG. 12A is a plan view of a configuration of a ground conductor of the radio-frequency circuit according to the second embodiment.

FIG. 12A is a plan view of a configuration of the ground conductor 80 of the radio-frequency circuit 5 of the second embodiment. As illustrated in the diagram, the ground conductor 80 is connected to via conductors 801 and 802, which are connected to the ground. Here, the number of via conductors connecting the ground conductor 80 to the ground is two or less.

According to this, the ground conductor 80 can be set to a weak ground potential, so that the inductor 43 and the inductor 44 can be coupled to a weak ground.

Figure 12B:
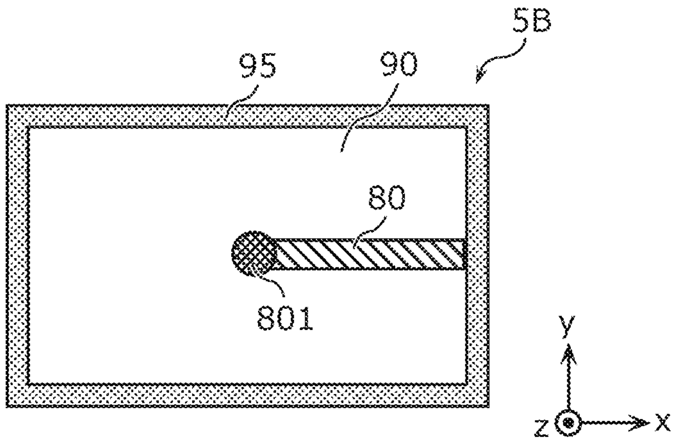
FIG. 12B is a plan view of a configuration of a ground conductor of a radio-frequency circuit according to a second variation of the second embodiment.

FIG. 12B is a plan view of a configuration of the ground conductor 80 of the radio-frequency circuit 5B according to the second variation of the second embodiment. As illustrated in the diagram, the ground conductor 80 may be connected to the via conductor 801 connected to the ground at one end and to a shield electrode layer 95 formed to cover a radio-frequency circuit 5B at the other end.

According to this, the ground conductor 80 can be set to a weak ground potential, so that the inductor 43 and the inductor 44 can be coupled to a weak ground.

2.5 Effects

As described above, the radio-frequency circuit 5 according to the present embodiment includes the low-noise amplifiers 61 and 62, the inductor 43 disposed in series in the path connecting the low-noise amplifier 61 and the common terminal 101, the filter 11 connected to the common terminals 101 and 102, the filter 15 connected to the common terminal 102, the inductor 44 disposed in series in the path connecting the low-noise amplifier 62 and the filter 15, and the ground conductor 80 disposed adjacent to the inductors 43 and 44 and capacitively and/or inductively coupled to the inductor 43 and capacitively and/or inductively coupled to the inductor 44.

According to this, the inductor 43 and the inductor 44 are weakly ground-coupled. Therefore, the unwanted wave component passing through the filter 11 and the unwanted wave component passing through the filter 15 can be canceled out at the coupling portion between the inductor 43 and the ground conductor 80 and also at the coupling portion between the inductor 44 and the ground conductor 80. In other words, the above-described unwanted wave components can be suppressed only by disposing the ground conductor 80 between the two transmission paths, thus providing a compact radio-frequency circuit 5 with improved radio-frequency signal transmission characteristics.

For example, the radio-frequency circuit 5 is provided with a substrate 90, each of the inductors 43 and 44 is constituted by a planar coil formed in or on the substrate 90, the ground conductor 80 is a planar conductor formed on a layer different from a layer on which the inductors 43 and 44 are formed, and, assuming the main surface of the substrate 90 is viewed in plan view, the inductor 43 partially overlaps the ground conductor 80, and the inductor 44 partially overlaps the ground conductor 80.

According to this, the inductor 43 is capacitively and/or inductively coupled to the ground conductor 80, and the inductor 44 is capacitively and/or inductively coupled to the ground conductor 80. This enables suppression of unwanted wave components entering the two reception paths only by disposing the ground conductor 80 between the reception paths including the inductor 43 and the inductor 44, thereby providing a compact radio-frequency circuit 5 with improved radio-frequency signal transmission characteristics.

Further, for example, the radio-frequency circuit 5A according to the first variation is provided with the substrate 90, each of the inductors 43 and 44 is constituted by a planar coil formed in or on the substrate 90, the ground conductor 80 is a planar conductor formed on the same layer as a layer on which the inductors 43 and 44 are formed, and, assuming the main surface of the substrate 90 is viewed in plan view, the inductor 43 and a part of the ground conductor 80 are disposed adjacent to each other, and the inductor 44 and a part of the ground conductor 80 are disposed adjacent to each other.

According to this, the inductor 43 is capacitively and/or inductively coupled to the ground conductor 80, and the inductor 44 is capacitively and/or inductively coupled to the ground conductor 80. This enables suppression of unwanted wave components entering the two reception paths only by disposing the ground conductor 80 between the reception paths including the inductor 43 and the inductor 44, thereby providing a compact radio-frequency circuit 5A with improved radio-frequency signal transmission characteristics.

Further, for example, in the radio-frequency circuits 5, 5A, and 5B, the number of via conductors connecting the planar conductor constituting the ground conductor 80 to the ground is two or less.

According to this, the ground conductor 80 can be set to a weak ground potential, so that the inductor 43 and the inductor 44 can be coupled to a weak ground.

Further, the communication device 6 according to the present embodiment is provided with the RFIC 3 that processes radio-frequency signals, and the radio-frequency circuit 5 that transmits the radio-frequency signals between the RFIC 3 and the antenna 2.

According to this, the effect of the radio-frequency circuit 5 can be realized in the communication device 6.

Other Forms of Implementation

The radio-frequency circuits and communication devices according to the present disclosure have been described based on the embodiments, examples, and variations. However, the radio-frequency circuits and communication devices according to the present disclosure are not limited to the above-mentioned embodiments, examples, and variations. Other embodiments realized by combining any of the components in the above embodiments, examples, and variations, variations resulting from various transformations of the above embodiments, examples, and variations that those skilled in the art can conceive of without departing from the gist of the present disclosure, and various devices incorporating the above-described radio-frequency circuits and communication devices are also included in the present disclosure.

For example, in the radio-frequency circuits and communication devices according to the above-described embodiments, examples, and variations, another circuit element, wire, or the like may be inserted between the paths connecting each circuit element and signal path disclosed in the drawings.

The features of the radio-frequency circuits and communication devices described based on each of the above embodiments are indicated below.

<1> A radio-frequency circuit, including a first common terminal and a second common terminal, a first bandpass filter connected to the first common terminal and the second common terminal and having a first pass band, a second bandpass filter connected to the first common terminal and the second common terminal and having a second pass band, and a cancellation circuit connected to the first common terminal and the second common terminal, connected in parallel with the first bandpass filter and the second bandpass filter, and configured to vary at least one of an amplitude and a phase in a bandpass characteristic.

<2> The radio-frequency circuit according to <1> further including a first amplifier connected to the first common terminal, and the second common terminal is connected to an antenna.

<3> The radio-frequency circuit according to <1> or <2>, further including a first switch disposed between the first common terminal and the first bandpass filter, the second bandpass filter, and the cancellation circuit, and a second switch disposed between the second common terminal and the first bandpass filter, the second bandpass filter, and the cancellation circuit.

<4> The radio-frequency circuit according to <3>, wherein the cancellation circuit includes at least one of a first variable capacitor disposed in a path connecting the first common terminal and the second switch, and a second variable capacitor disposed in a path connecting the second common terminal and the first switch.

<5> The radio-frequency circuit according to <4>, wherein the at least one of the first variable capacitor and the second variable capacitor is a DTC.

<6> The radio-frequency circuit according to <4> or <5> wherein the cancellation circuit includes the first variable capacitor and the second variable capacitor, assuming the first common terminal, the first bandpass filter, and the second common terminal are connected by switching connection of the first switch and the second switch, the first common terminal, the cancellation circuit, and the second common terminal are connected, a capacitance value of the first variable capacitor becomes a first capacitance value, and a capacitance value of the second variable capacitor becomes a second capacitance value, and assuming the first common terminal, the second bandpass filter, and the second common terminal are connected by switching connection of the first switch and the second switch, the first common terminal, the cancellation circuit, and the second common terminal are connected, the capacitance value of the first variable capacitor becomes a third capacitance value different from the first capacitance value, and the capacitance value of the second variable capacitor becomes a fourth capacitance value different from the second capacitance value.

<7> The radio-frequency circuit according to any of <4> to <6>, wherein the cancellation circuit includes the first variable capacitor and the second variable capacitor, and the radio-frequency circuit further includes a first inductor connected to the first variable capacitor and the second variable capacitor.

<8> The radio-frequency circuit according to any of <4> to <7>, wherein the cancellation circuit includes the first variable capacitor and the second variable capacitor, and the radio-frequency circuit further includes a second inductor connected between a path connecting the first variable capacitor and the second variable capacitor and a ground.

<9> The radio-frequency circuit according to any of <4> to <8>, wherein the cancellation circuit further includes at least one of a first phase-shift circuit connected to the first switch and a second phase-shift circuit connected to the second switch.

<10> The radio-frequency circuit according to any of <3> to <9>, wherein the first switch, the second switch, and the cancellation circuit are included in a first integrated circuit.

<11> The radio-frequency circuit according to any of <1> to <10>, wherein in the bandpass characteristic of the cancellation circuit, an insertion loss is 10 dB or more over a frequency range from a DC to three times a frequency of a high frequency end of a high frequency side out of a high frequency end of the first pass band and a high frequency end of the second pass band.

<12> The radio-frequency circuit according to any of <1> to <11>, wherein no bandpass filter is connected to a path connecting the first common terminal, the cancellation circuit, and the second common terminal.

<13> The radio-frequency circuit according to any of <1> to <12>, wherein no acoustic wave filter is connected to a path connecting the first common terminal, the cancellation circuit, and the second common terminal.

<14> The radio-frequency circuit according to <2>, further including a third inductor disposed in series in a path connecting the first amplifier and the first common terminal, a second amplifier, a third bandpass filter connected to the second common terminal, a fourth inductor disposed in series in a path connecting the second amplifier and the third bandpass filter, and a ground conductor disposed adjacent to the third inductor and the fourth inductor and capacitively and/or inductively coupled to the third inductor and capacitively and/or inductively coupled to the fourth inductor.

<15> The radio-frequency circuit according to <14>, further including a substrate, wherein each of the third inductor and the fourth inductor is constituted by a planar coil formed in or on the substrate, the ground conductor is a planar conductor formed on a layer different from a layer on which the third inductor and the fourth inductor are formed, and assuming a main surface of the substrate is viewed in plan view, the third inductor partially overlaps the ground conductor, and the fourth inductor partially overlaps the ground conductor.

<16> The radio-frequency circuit according to <14>, further including a substrate, wherein each of the third inductor and the fourth inductor is constituted by a planar coil formed in or on the substrate, the ground conductor is a planar conductor formed on a same layer as a layer on which the third inductor and the fourth inductor are formed, and assuming a main surface of the substrate is viewed in plan view, the third inductor and a part of the ground conductor are disposed adjacent to each other, and the fourth inductor and a part of the ground conductor are disposed adjacent to each other.

<17> The radio-frequency circuit according to <15> or <16>, wherein a number of via conductors connecting the planar conductor to the ground is two or less.

<18> A communication device, including a signal processing circuit that processes a radio-frequency signal, and the radio-frequency circuit according to any of <1> to <17> that transmits the radio-frequency signal between the signal processing circuit and an antenna.

The present disclosure can be widely used in communication devices such as cellular phones as a radio-frequency circuit and a communication device placed in the front-end section.

What is claimed is:

1. A radio-frequency circuit, comprising:

a first common terminal and a second common terminal;

a first bandpass filter connected to the first common terminal and the second common terminal and having a first pass band;

a second bandpass filter connected to the first common terminal and the second common terminal and having a second pass band;

a cancellation circuit connected to the first common terminal and the second common terminal, connected in parallel with the first bandpass filter and the second bandpass filter, the cancellation circuit configured to vary at least one of an amplitude and a phase in a bandpass characteristic;

a first switch disposed between the first common terminal and the first bandpass filter, the second bandpass filter, and the cancellation circuit; and a second switch disposed between the second common terminal and the first bandpass filter, the second bandpass filter, and the cancellation circuit; wherein the first common terminal and the second common terminal are configured to connect to the first bandpass filter and the cancellation circuit simultaneously.

2. The radio-frequency circuit according to claim 1, further comprising:

a first amplifier connected to the first common terminal; and the second common terminal is connected to an antenna.

3. The radio-frequency circuit according to claim 1, further comprising:

a first switch disposed between the first common terminal and the first bandpass filter, the second bandpass filter, and the cancellation circuit; and a second switch disposed between the second common terminal and the first bandpass filter, the second bandpass filter, and the cancellation circuit.

4. The radio-frequency circuit according to claim 1, wherein the cancellation circuit includes at least one of a first variable capacitor disposed in a path connecting the first common terminal and the second switch, and a second variable capacitor disposed in a path connecting the second common terminal and the first switch.

5. The radio-frequency circuit according to claim 4, wherein the at least one of the first variable capacitor and the second variable capacitor is a digitally tunable capacitor (DTC).

6. The radio-frequency circuit according to claim 4, wherein the cancellation circuit includes the first variable capacitor and the second variable capacitor, in a first configuration in which the first common terminal, the first bandpass filter, and the second common terminal are connected by switching connection of the first switch and the second switch, the first common terminal, the cancellation circuit, and the second common terminal are connected, a capacitance value of the first variable capacitor becomes a first capacitance value, and a capacitance value of the second variable capacitor becomes a second capacitance value, and in a second configuration in which the first common terminal, the second bandpass filter, and the second common terminal are connected by switching connection of the first switch and the second switch, the first common terminal, the cancellation circuit, and the second common terminal are connected, the capacitance value of the first variable capacitor becomes a third capacitance value different from the first capacitance value, and the capacitance value of the second variable capacitor becomes a fourth capacitance value different from the second capacitance value.

7. The radio-frequency circuit according to claim 4, wherein the cancellation circuit includes the first variable capacitor and the second variable capacitor, and the radio-frequency circuit further includes a first inductor connected to the first variable capacitor and the second variable capacitor.

8. The radio-frequency circuit according to claim 4, wherein the cancellation circuit includes the first variable capacitor and the second variable capacitor, and the radio-frequency circuit further includes a second inductor connected between a path connecting the first variable capacitor and the second variable capacitor and a ground.

9. The radio-frequency circuit according to claim 4, wherein the cancellation circuit further includes at least one of a first phase-shift circuit connected to the first switch and a second phase-shift circuit connected to the second switch.

10. The radio-frequency circuit according to claim 1, wherein the first switch, the second switch, and the cancellation circuit are included in a first integrated circuit.

11. A radio-frequency circuit, comprising:

a first common terminal and a second common terminal;

a first bandpass filter connected to the first common terminal and the second common terminal and having a first pass band;

a second bandpass filter connected to the first common terminal and the second common terminal and having a second pass band; and a cancellation circuit connected to the first common terminal and the second common terminal, connected in parallel with the first bandpass filter and the second bandpass filter, the cancellation circuit configured to vary at least one of an amplitude and a phase in a bandpass characteristic, wherein in the bandpass characteristic of the cancellation circuit, an insertion loss is 10 dB or more over a frequency range from a DC to three times a frequency of a high frequency end of a high frequency side out of a high frequency end of the first pass band and a high frequency end of the second pass band.

12. The radio-frequency circuit according to claim 1, wherein no bandpass filter is connected to a path connecting the first common terminal, the cancellation circuit, and the second common terminal.

13. The radio-frequency circuit according to claim 1, wherein no acoustic wave filter is connected to a path connecting the first common terminal, the cancellation circuit, and the second common terminal.

14. The radio-frequency circuit according to claim 2, further comprising:

a third inductor disposed in series in a path connecting the first amplifier and the first common terminal;

a second amplifier;

a third bandpass filter connected to the second common terminal;

a fourth inductor disposed in series in a path connecting the second amplifier and the third bandpass filter; and a ground conductor disposed adjacent to the third inductor and the fourth inductor and capacitively and/or inductively coupled to the third inductor and capacitively and/or inductively coupled to the fourth inductor.

15. The radio-frequency circuit according to claim 14, further comprising:

a substrate, wherein each of the third inductor and the fourth inductor is constituted by a planar coil formed in or on the substrate, the ground conductor is a planar conductor formed on a layer different from a layer on which the third inductor and the fourth inductor are formed, and when a main surface of the substrate is viewed in plan view, the third inductor partially overlaps the ground conductor, and the fourth inductor partially overlaps the ground conductor.

16. The radio-frequency circuit according to claim 14, further comprising:

a substrate, wherein each of the third inductor and the fourth inductor is constituted by a planar coil formed in or on the substrate, the ground conductor is a planar conductor formed on a same layer as a layer on which the third inductor and the fourth inductor are formed, and when a main surface of the substrate is viewed in plan view, the third inductor and a part of the ground conductor are disposed adjacent to each other, and the fourth inductor and a part of the ground conductor are disposed adjacent to each other.

17. The radio-frequency circuit according to claim 15, wherein a number of via conductors connecting the planar conductor to the ground is two or less.

18. A communication device, comprising:

a signal processing circuit that processes a radio-frequency signal; and the radio-frequency circuit according to claim 1 that transmits the radio-frequency signal between the signal processing circuit and an antenna.

19. The radio-frequency circuit according to claim 1, wherein:

the first switch includes a first terminal connected to the first common terminal and a plurality of second terminals connected to the first bandpass filter, the second bandpass filter, and the cancellation circuit, respectively; and the first switch is configured to connect the first terminal to the second terminal connected to the cancellation circuit while simultaneously connecting the first terminal to the second terminal connected to the first bandpass filter.

* * * * *